United States Patent
Jeong et al.

(10) Patent No.: US 12,408,382 B2
(45) Date of Patent: Sep. 2, 2025

(54) SEMICONDUCTOR MEMORY DEVICE HAVING A CONFINEMENT LAYER WITH A TWO-DIMENSIONAL ELECTRON GAS IN THE CONFINEMENT LAYER

(71) Applicant: Samsung Electronics Co., Ltd., Suwon-si (KR)

(72) Inventors: Jae Kyeong Jeong, Seoul (KR); Min Tae Ryu, Hwaseong-si (KR); Hyeon Joo Seul, Seoul (KR); Sungwon Yoo, Hwaseong-si (KR); Wonsok Lee, Suwon-si (KR); Min Hee Cho, Suwon-si (KR); Jae Seok Hur, Seoul (KR)

(73) Assignees: Samsung Electronics Co., Ltd., Gyeonggi-Do (KR); IUCF-HYU (Industry-University Cooperation Foundation Hanyang University), Seoul (KR)

( * ) Notice: Subject to any disclaimer, the term of this patent is extended or adjusted under 35 U.S.C. 154(b) by 598 days.

(21) Appl. No.: 17/694,903

(22) Filed: Mar. 15, 2022

(65) Prior Publication Data

US 2022/0367721 A1    Nov. 17, 2022

(30) Foreign Application Priority Data

May 14, 2021    (KR) .......................... 10-2021-0062532

(51) Int. Cl.
*H01L 29/786*    (2006.01)
*H01L 23/00*    (2006.01)
(Continued)

(52) U.S. Cl.
CPC ......... *H10D 30/6755* (2025.01); *H01L 24/08* (2013.01); *H10B 12/05* (2023.02);
(Continued)

(58) Field of Classification Search
CPC ............. H10D 30/6755; H10D 30/475; H10D 30/477; H10D 30/478; H10D 30/6757;
(Continued)

(56) References Cited

U.S. PATENT DOCUMENTS

| 8,049,212 B2 | 11/2011 | Jeong et al. |
| 9,647,135 B2 | 5/2017 | Nomura |

(Continued)

FOREIGN PATENT DOCUMENTS

| KR | 10-2017-0142982 A | 12/2017 |
| KR | 10-2018-0049780 A | 5/2018 |

(Continued)

OTHER PUBLICATIONS

Dongyoon Khim, et al. "Modulation-Doped In2o3/ZnO Heterojunction Transistors Processed from Solution," Advanced Materials, vol. 29, pp. 1605837-1605837 (2017).

(Continued)

*Primary Examiner* — Mohammed R Alam
(74) *Attorney, Agent, or Firm* — Harness, Dickey & Pierce, P.L.C.

(57) ABSTRACT

Provided is a semiconductor memory device comprising a bit line extending in a first direction, a channel pattern on the bit line and including a first oxide semiconductor layer in contact with the bit line and a second oxide semiconductor layer on the first oxide semiconductor layer, wherein each of the first and second oxide semiconductor layers includes a horizontal part parallel to the bit line and first and second vertical parts that vertically protrude from the horizontal part, first and second word lines between the first and second vertical parts of the second oxide semiconductor layer and on the horizontal part of the second oxide semiconductor layer, and a gate dielectric pattern between the channel pattern and the first and second word lines. A thickness of the (Continued)

second oxide semiconductor layer is greater than that of the first oxide semiconductor layer.

20 Claims, 35 Drawing Sheets

(51) Int. Cl.
  *H10B 12/00* (2023.01)
  *H10D 30/47* (2025.01)
  *H10D 30/67* (2025.01)
  *H10D 62/80* (2025.01)
  *H10D 99/00* (2025.01)
(52) U.S. Cl.
  CPC ........... *H10B 12/50* (2023.02); *H10D 30/475* (2025.01); *H10D 30/477* (2025.01); *H10D 30/478* (2025.01); *H10D 30/6757* (2025.01); *H10D 62/80* (2025.01); *H10D 99/00* (2025.01); *H01L 2224/08145* (2013.01)
(58) Field of Classification Search
  CPC .... H10D 62/80; H10D 99/00; H10D 84/0128; H01L 24/08; H01L 2224/08145; H01L 21/0228; H10B 12/05; H10B 12/50; H10B 61/20; H10B 63/80; H10B 12/30
  See application file for complete search history.

(56) References Cited

U.S. PATENT DOCUMENTS

| | | |
|---|---|---|
| 10,658,446 B2 | 5/2020 | Liu |
| 10,784,325 B2 | 9/2020 | Ahmed et al. |
| 2012/0156868 A1 | 6/2012 | Kim et al. |
| 2013/0161730 A1* | 6/2013 | Pan ...................... H10B 12/053 |
| | | 257/E27.06 |
| 2018/0033858 A1 | 2/2018 | Moon et al. |
| 2020/0176603 A1* | 6/2020 | Baeck .................. H10K 59/126 |
| 2020/0212076 A1 | 7/2020 | Jang et al. |
| 2020/0295196 A1 | 9/2020 | Asami |
| 2022/0102352 A1* | 3/2022 | Lee ...................... H10B 12/315 |
| 2022/0199628 A1* | 6/2022 | Sato ...................... H10B 12/488 |

FOREIGN PATENT DOCUMENTS

| | | |
|---|---|---|
| KR | 10-1878161 B1 | 7/2018 |
| KR | 10-2018-0101754 A | 9/2018 |
| KR | 10-1941439 B1 | 1/2019 |
| KR | 10-2020-0079900 A | 7/2020 |
| KR | 10-2164861 B1 | 10/2020 |
| KR | 10-2187129 B1 | 12/2020 |

OTHER PUBLICATIONS

Hyeon Joo Seul, et al. "Atomic Layer Deposition Process-Enabled Carrier Boosting in Field-Effect Transistors through a Nanoscale ZnO/IGO Heterojunction," Applied Materials & Interfaces, American Chemical Society, pp. 33887-33898 (2020).

C.P. Yang, et al. "Thin-Film Transistors with Amorphous Indium-Gallium-Oxide Bilayer Channel," IEEE Electron Device Letters, vol. 38, No. 5, pp. 572-575 (2017).

* cited by examiner

FIG. 3B

| | $In_{0.61}Ga_{0.16}Zn_{0.23}O$ | Heterojunction TFT | | |
|---|---|---|---|---|
| | | $In_{0.38}Ga_{0.44}Zn_{0.18}O$ /$In_{0.61}Ga_{0.16}Zn_{0.23}O$ | $In_{0.52}Ga_{0.32}Zn_{0.15}O$ /$In_{0.61}Ga_{0.16}Zn_{0.23}O$ | $In_{0.46}Ga_{0.19}Zn_{0.34}O$ /$In_{0.61}Ga_{0.16}Zn_{0.23}O$ |
| $\mu FE\ [cm^2/Vs]$ | 24.7 | 34.7 | 44.4 | 45.5 |
| SS [V/dec] | 0.27 | 0.23 | 0.24 | 0.29 |
| $V_{TH}$ [V] | 0.19 | −0.25 | −0.73 | −1.75 |

SEMICONDUCTOR MEMORY DEVICE HAVING A CONFINEMENT LAYER WITH A TWO-DIMENSIONAL ELECTRON GAS IN THE CONFINEMENT LAYER

CROSS-REFERENCE TO RELATED APPLICATION

This U.S. nonprovisional application claims priority under 35 U.S.C § 119 to Korean Patent Application No. 10-2021-0062532 filed on May 14, 2021 in the Korean Intellectual Property Office, the disclosure of which is hereby incorporated by reference in its entirety.

PARTIES TO A JOINT RESEARCH AGREEMENT

The presently claimed invention was made by or on behalf of the below listed parties to a joint research agreement. The joint research agreement was in effect on or before the date the claimed invention was made, and the claimed invention was part of the joint research agreement and made as a result of activities undertaken within the scope of the joint research agreement. The parties to the joint research agreement are Samsung Electronics Co., LTD. and Industry University Cooperation Foundation IUCF HYU.

BACKGROUND

Inventive concepts relate to a semiconductor memory device, and more particularly, to a semiconductor memory device including vertical channel transistors and/or a method of fabricating the same.

A reduction in design rule of semiconductor devices causes fabrication techniques to increase integration, operating speed, and/or yield of semiconductor devices. Accordingly, transistors with vertical channels have been suggested to increase the transistor's integration, resistance, current drive capability, and/or etc.

SUMMARY

Some example embodiments of inventive concepts provide a semiconductor memory device with improved electrical properties and increased integration.

According to some example embodiments of inventive concepts, a semiconductor memory device may include a bit line extending in a first direction; a channel pattern on the bit line, the channel pattern including a first oxide semiconductor layer in contact with the bit line and a second oxide semiconductor layer on the first oxide semiconductor layer, each of the first and second oxide semiconductor layers including a horizontal part parallel to the bit line and a first vertical part and a second vertical part that vertically protrude from the horizontal part; a first word line and a second word line that are between the first and second vertical parts of the second oxide semiconductor layer and are on the horizontal part of the second oxide semiconductor layer, the first and second word lines running across the bit line; and a gate dielectric pattern between the channel pattern and the first and second word lines. A thickness of the second oxide semiconductor layer may be greater than a thickness of the first oxide semiconductor layer.

According to some example embodiments of inventive concepts, a semiconductor memory device may include a bit line that extends in a first direction; a channel pattern on the bit line, the channel pattern including a horizontal part parallel to the bit line, and a first vertical part and a second vertical part that vertically protrude from the horizontal part; a first word line on the horizontal part of the channel pattern, the first word line running across the bit line and extending in a second direction; and a gate dielectric pattern between the first word line and the channel pattern. The channel pattern may include: a first oxide semiconductor layer in contact with the bit line; and a second oxide semiconductor layer on the first oxide semiconductor layer. A concentration of gallium (Ga) in the first oxide semiconductor layer may be greater than a concentration of gallium (Ga) in the second oxide semiconductor layer.

According to some example embodiments of inventive concepts, a semiconductor memory device may include a bit line that extends in a first direction; a first dielectric pattern defining a trench that runs across the bit line and extends in a second direction; a channel pattern in the trench, the channel pattern including a first vertical part and a second vertical part that face each other and a first horizontal part that connects the first and second vertical parts to each other; a first word line and a second word line that lie on the first horizontal part of the channel pattern and extend in the second direction, the first word line being adjacent to the first vertical part of the channel pattern, and the second word line being adjacent to the second vertical part of the channel pattern; a gate dielectric pattern between the channel pattern and the first and second word lines, the gate dielectric pattern extending in the second direction; a second dielectric pattern in the trench, the second dielectric pattern covering the first and second word lines; a first data storage pattern on the first vertical part of the channel pattern; a second data storage pattern on the second vertical part of the channel pattern; and a plurality of landing pads between the first vertical part and the first data storage pattern and between the second vertical part and the second data storage pattern. The channel pattern may include: a first oxide semiconductor layer in contact with the bit line; and a second oxide semiconductor layer on the first oxide semiconductor layer. Each of the first and second oxide semiconductor layers may include a second horizontal part parallel to the bit line and a first vertical part and a second vertical part that vertically protrude from the second horizontal part. A thickness of the second oxide semiconductor layer may be greater than a thickness of the first oxide semiconductor layer.

BRIEF DESCRIPTION OF THE DRAWINGS

FIG. 3B illustrates a table showing the dependence of electrical properties upon composition ratios of oxide semiconductor layers.

FIGS. 16A to 21A, 16B to 21B, and 16C to 21C illustrate cross-sectional views respectively taken along lines A-A', B-B', and C-C' of FIG. 8, showing a method of fabricating a semiconductor memory device according to some example embodiments of inventive concepts.

DETAILED DESCRIPTION OF EXAMPLE EMBODIMENTS

Figure 1:
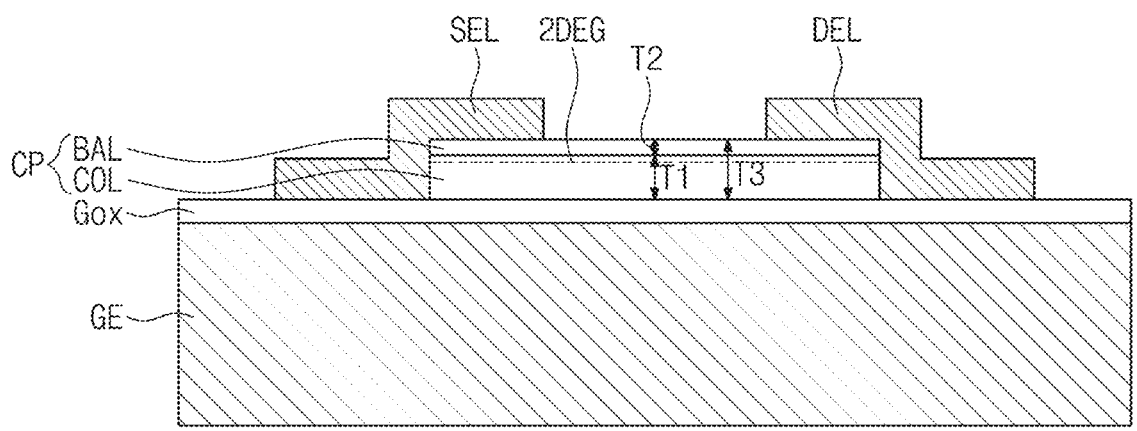
FIG. 1 illustrates a cross-sectional view showing a semiconductor device according to some example embodiments of inventive concepts.

FIG. 1 illustrates a cross-sectional view showing a semiconductor device according to some example embodiments of inventive concepts.

Referring to FIG. 1, a semiconductor device may include a gate electrode GE. The gate electrode GE may include, for example, doped polysilicon, metal, conductive metal nitride, conductive metal silicide, conductive metal oxide, or any combination thereof. The gate electrode GE may be formed of doped polysilicon (e.g. polysilicon doped with at least one of boron, phosphorus, or arsenic), Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof, but inventive concepts are not limited thereto. The gate electrode GE may include a single or multiple layer including the material discussed above. In some example embodiments, the gate electrode GE may include a two-dimensional semiconductor material, such as graphene, carbon nano-tube, or any combination thereof.

A gate dielectric pattern Gox may be provided on the gate electrode GE. The gate dielectric pattern Gox may have a uniform thickness to cover/blanket a surface of the gate electrode GE. The gate dielectric pattern Gox may be formed of/include a silicon oxide layer, a silicon oxynitride layer, a high-k dielectric layer whose dielectric constant is greater than that of a silicon oxide layer, or any combination thereof. The high-k dielectric layer may be formed of metal oxide or metal oxynitride. The high-k dielectric layer possibly used as the gate dielectric pattern Gox may be formed of/include $HfO_2$, HfSiO, HfSiON, HfTaO, HfSiO, HfZrO, $ZrO_2$, $Al_2O_3$, or any combination thereof, but inventive concepts are not limited thereto.

A channel pattern CP may be provided on the gate dielectric pattern Gox. The channel pattern CP may include a confinement layer COL provided on the gate dielectric pattern Gox and a barrier layer BAL provided on the confinement layer COL. The confinement layer COL and the barrier layer BAL may each be called an oxide semiconductor layer. The channel pattern CP may include an oxide semiconductor material. For example, the oxide semiconductor material may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or any combination thereof. For example, the barrier layer BAL and the confinement layer COL may each include indium gallium zinc oxide (IGZO) and may include the same, or different, materials. The channel pattern CP may include the same, or different, materials from that of the gate dielectric pattern GOx.

A two-dimensional electron gas (2DEG) may be formed within the confinement layer COL. The two-dimensional electron gas (2DEG) may be formed in an inside of the confinement layer COL, and may be adjacent to an interface between the confinement layer COL and the barrier layer BAL.

Additionally or alternatively, the confinement layer COL and the barrier layer BAL may have their uniform thicknesses. A first thickness T1 may be defined to indicate the thickness of the confinement layer COL. A second thickness T2 may be defined to indicate the thickness of the barrier layer BAL. A third thickness T3 may be defined to indicate a thickness of the channel pattern CP. The third thickness T3 may be a sum of the first thickness T1 and the second thickness T2. The first thickness T1 may be greater than the second thickness T2. For example, the second thickness T2 may range from about 1 nm to about 3 nm, and the first thickness T1 may range from about 3 nm to about 7 nm. The third thickness T3 may range from about 4 nm to about 10 nm.

Additionally or alternatively, a concentration of gallium (Ga) in the confinement layer COL may be less than that in the barrier layer BAL. A concentration of indium (In) in the confinement layer COL may be greater than that in the barrier layer BAL. For example, the confinement layer COL may include IGZO, which may have a composition ratio of $In_{0.61}Ga_{0.16}Zn_{0.23}O$, and the barrier layer BAL may include IGZO, which may have a composition ratio of $In_{0.38}Ga_{0.44}Zn_{0.18}O$, $In_{0.52}Ga_{0.32}Zn_{0.15}O$, or $In_{0.46}Ga_{0.19}Zn_{0.34}O$.

Additionally or alternatively, the confinement layer COL may have a band gap less than that of the barrier layer BAL. For example, when the confinement layer COL whose thickness is about 5 nm has a composition ratio of $In_{0.61}Ga_{0.16}Zn_{0.23}O$, the confinement layer COL may have a band gap of about 3.59 eV, and when the barrier layer BAL whose thickness is about 2 nm has a composition ratio of $In_{0.46}Ga_{0.19}Zn_{0.34}O$, the barrier layer BAL may have a band gap of about 4.02 eV. An oxide semiconductor layer may have a band gap that increases with an increase in concentration of gallium.

Additionally or alternatively, the confinement layer COL may have a work function greater than that of the barrier layer BAL. For example, when the confinement layer COL whose thickness is about 5 nm has a composition ratio of $In_{0.61}Ga_{0.16}Zn_{0.23}O$, the confinement layer COL may have a work function of about 4.64 eV, and when the barrier layer BAL whose thickness is about 2 nm has a composition ratio of $In_{0.46}Ga_{0.19}Zn_{0.34}O$, the barrier layer BAL may have a work function of about 4.34 eV. An oxide semiconductor layer may have a work function that increases with an increase in concentration of gallium and a reduction in concentration of indium. Additionally or alternatively, an oxide semiconductor layer may have a work function that increases with an increase in thickness thereof.

The greater difference in work function between the confinement layer COL and the barrier layer BAL, the higher electron mobility in/within the channel pattern CP. Therefore, in order to improve electrical properties of the semiconductor device, it may be important to control the work functions of the confinement layer COL and the barrier layer BAL. The difference in work function may be increased by controlling a thickness of each of the confinement layer COL and the barrier layer BAL and/or a composition ratio of each of oxide semiconductor materials included in the confinement layer COL and the barrier layer BAL.

A source electrode SEL and a drain electrode DEL may be provided on the channel pattern CP. The source electrode SEL and the drain electrode DEL may be spaced apart from each other. For example, the source electrode SEL and the drain electrode DEL may each include a metallic material, such as aluminum (Al), tungsten (W), and/or molybdenum (Mo). Alternatively or additionally, the source electrode SEL and the drain electrode DEL may each include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof, but inventive concepts are not limited thereto. The source electrode SEL and the drain electrode DEL may extend along a top surface of the gate dielectric pattern Gox, a sidewall of the channel pattern CP, and a top surface of the channel pattern CP.

Figure 2:
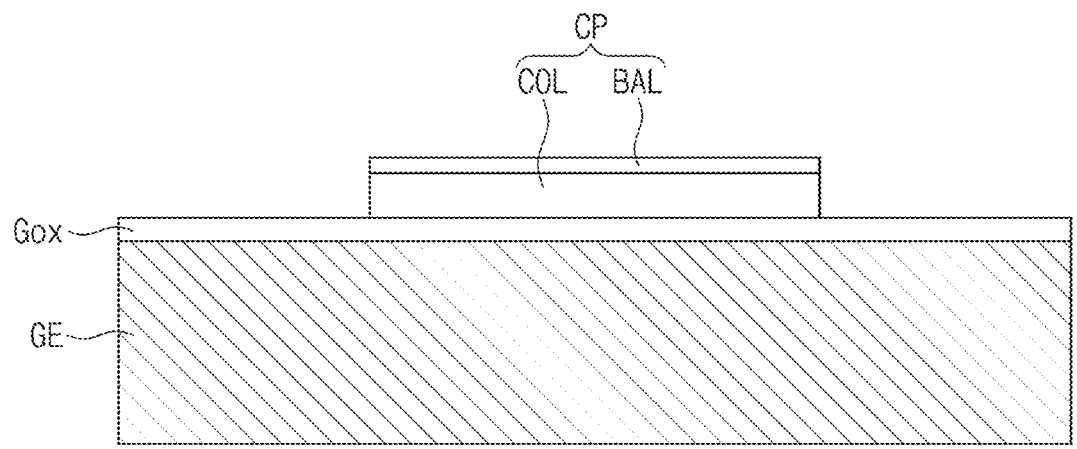
FIG. 2 illustrates a cross-sectional view showing a method of fabricating a semiconductor device according to some example embodiments of inventive concepts.

FIG. 2 illustrates a cross-sectional view showing a method of fabricating a semiconductor device according to some example embodiments of inventive concepts.

Referring to FIG. 2, a gate dielectric pattern Gox may be formed on a gate electrode GE. An oxidation process such as a thermal oxidation process and/or an in-situ steam generation (ISSG) process may be used to form the gate dielectric pattern GOx; however, example embodiments are not limited thereto. Portions of the gate electrode GE may be consumed during the formation of the gate dielectric pattern GOx; however, example embodiments are not limited thereto. A channel pattern CP may be formed on the gate dielectric pattern Gox. An atomic layer deposition (ALD) process may be used to form the channel pattern CP.

For example, the formation of the channel pattern CP may include forming a confinement layer COL on the gate dielectric pattern Gox, forming a barrier layer BAL on the confinement layer COL, and etching the barrier layer BAL and the confinement layer COL. The confinement layer COL and the barrier layer BAL may each be formed by using an atomic layer deposition process, with a single, in-situ process within one tool and/or chamber, or in separate, ex-situ processes with different tools and/or chambers. When forming the confinement layer COL and the barrier layer BAL, an atomic layer deposition cycle may be adjusted based on thicknesses of the confinement layer COL and the barrier layer BAL. The thicknesses of the confinement layer COL and the barrier layer BAL may be determined in-situ during deposition and/or ex-situ between the deposition of the confinement layer COL and the barrier layer BAL, for example with an ellipsometry tool; however, example embodiments are not limited thereto.

In addition, when an atomic layer deposition process is performed, an introduction amount of a precursor of indium (In), gallium (Ga), or zinc (Zn) may be adjusted to control composition ratios of oxide semiconductor materials included in the confinement layer COL and the barrier layer BAL.

The confinement layer COL and the barrier layer BAL may have their thicknesses different from each other. A first thickness T1 may be defined to indicate the thickness of the confinement layer COL. A second thickness T2 may be defined to indicate the thickness of the barrier layer BAL. A third thickness T3 may be defined to indicate a thickness of the channel pattern CP. The third thickness T3 may be a sum of the first thickness T1 and the second thickness T2. The first thickness T1 may be greater than the second thickness T2. For example, the second thickness T2 may range from about 1 nm to about 3 nm, and the first thickness T1 may range from about 3 nm to about 7 nm. The third thickness T3 may range from about 4 nm to about 10 nm.

According to some example embodiments of inventive concepts, when forming the confinement layer COL and the barrier layer BAL, an atomic layer deposition process may be used to control the channel pattern CP to have a thickness equal to or less than about 10 nm. Therefore, it may be possible to increase integration of a semiconductor device and/or to easily or more easily control any or all of thicknesses, composition ratios, band gaps, and work functions of the confinement layer COL and the barrier layer BAL, and/or to manufacture a transistor with high mobility. Alternatively or additionally, the atomic layer deposition process may be performed at relatively low temperatures equal to or less than about 500° C., and thus it may be possible to easily control physical properties of the confinement layer COL and the barrier layer BAL. As a result, the semiconductor device may increase in electrical properties.

Referring back to FIG. 1, a source electrode SEL and a drain electrode DEL may be formed on the channel pattern CP. Eventually, a thin-film transistor (TFT) may be fabricated which includes an oxide semiconductor layer.

Figure 3A:
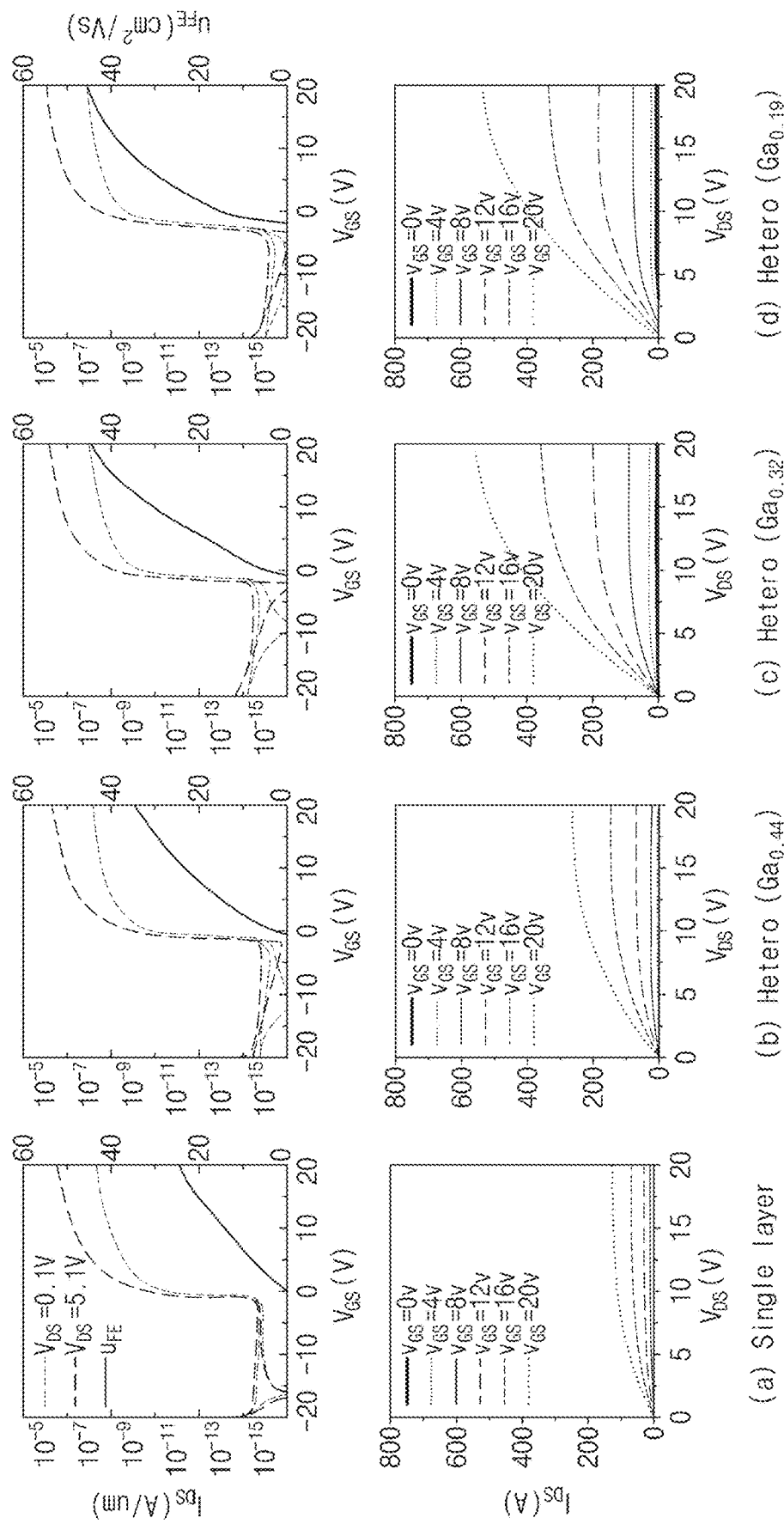
FIG. 3A illustrates graphs showing the dependence of electrical properties upon composition ratios of oxide semiconductor layers.

FIG. 3A illustrates graphs showing the dependence of electrical properties upon composition ratios of oxide semiconductor layers. FIG. 3B illustrates a table showing the dependence of electrical properties upon composition ratios of oxide semiconductor layers.

Referring to FIGS. 3A and 3B, it may be ascertained that electrical properties/performance of the semiconductor device is increased more in a case (or hetero case) where the confinement layer COL is provided thereon with the barrier layer BAL having a thickness of about 2 nm and a composition ratio of $In_{0.38}Ga_{0.44}Zn_{0.18}O$, $In_{0.52}Ga_{0.32}Zn_{0.15}O$, or $In_{0.46}Ga_{0.19}Zn_{0.34}O$ than in case (or single layer case) where is provided only the confinement layer COL having a thickness of about 5 nm and a composition ratio of $In_{0.61}Ga_{0.16}Zn_{0.23}O$. For example, when the barrier layer BAL is provided, the semiconductor device may be optimized in terms of electron mobility $\mu_{FE}$, subthreshold swing SS, and threshold voltage $V_{TH}$.

Figure 4A:
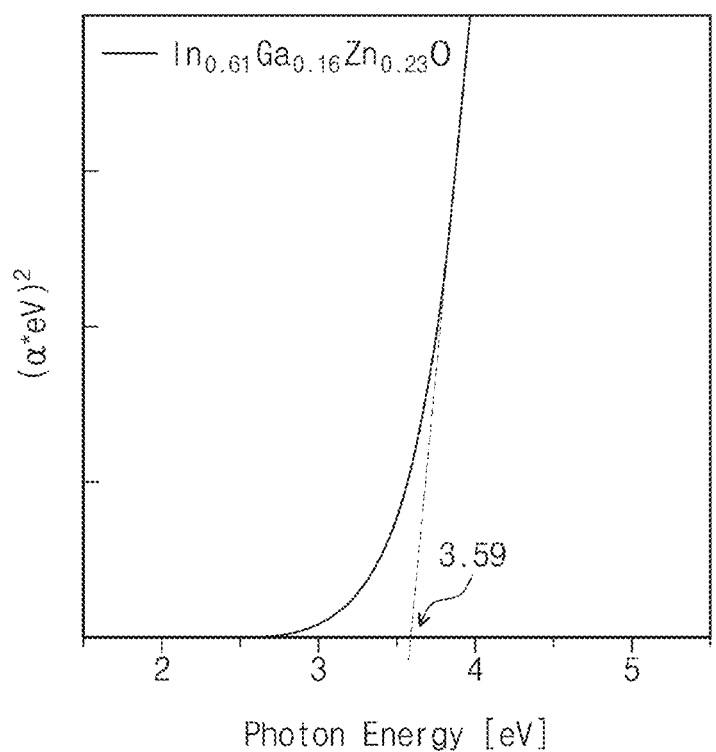
FIGS. 4A and 4B illustrate graphs showing the dependence of band gap upon composition ratio of oxide semiconductor layer.
Figure 4B:
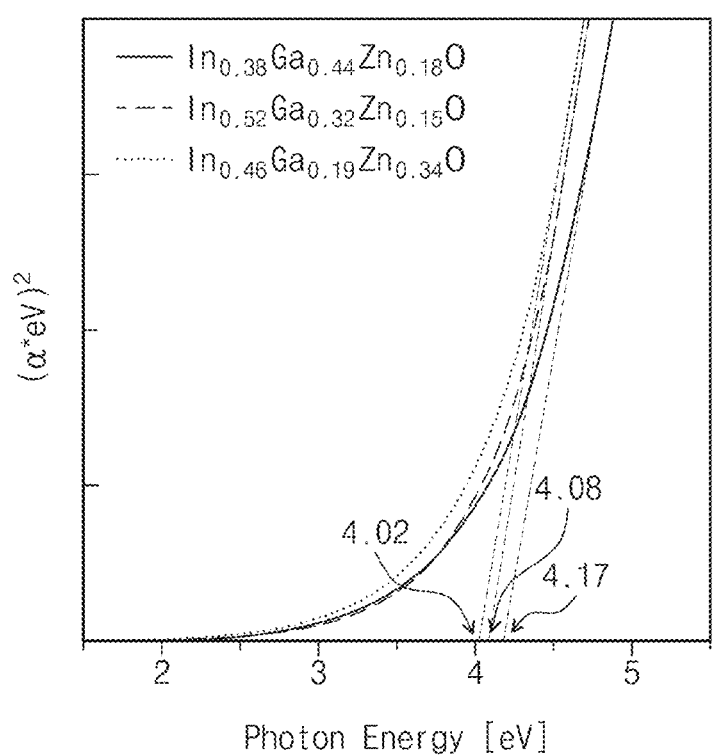
Figure 4C:
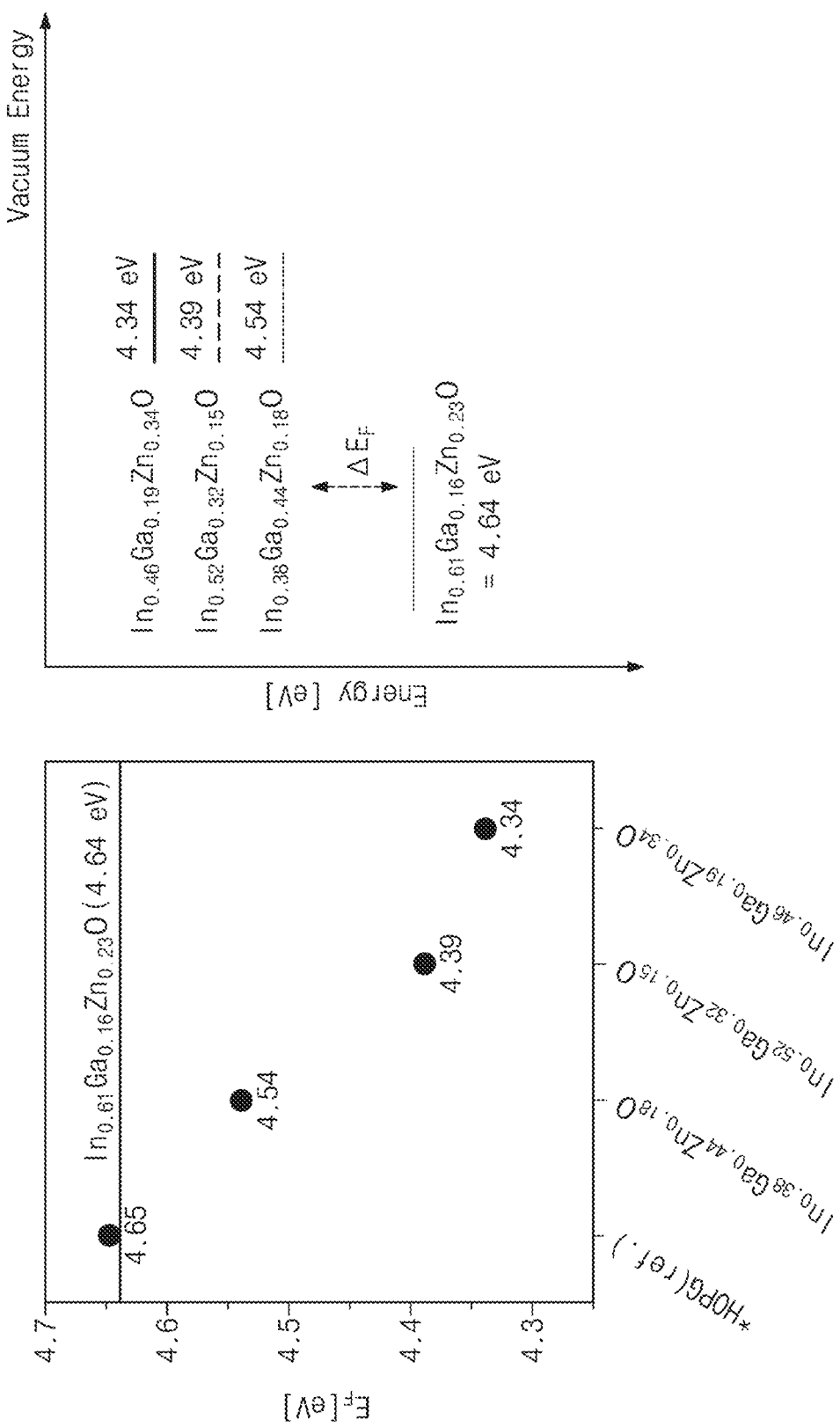
FIG. 4C illustrates a graph showing the dependence of work function upon composition ratio of oxide semiconductor layer.

FIGS. 4A and 4B illustrate graphs showing the dependence of band gap upon composition ratio of oxide semiconductor layer. FIG. 4C illustrates a graph showing the dependence of work function on composition ratio of oxide semiconductor layer. In FIG. 4C, the language "HOPG" denotes "highly oriented pyrolytic graphite."

Referring to FIGS. 4A and 4B, a band gap of about 3.59 eV may be given to the confinement layer COL having a thickness of about 5 nm and a composition ratio of $In_{0.61}Ga_{0.16}Zn_{0.23}O$. A band gap of about 4.02 eV may be given to the barrier layer BAL having a thickness of about 2 nm and a composition ratio of $In_{0.46}Ga_{0.19}Zn_{0.34}O$, a band gap of about 4.08 eV may be given to the barrier layer BAL having a thickness of about 2 nm and a composition ratio of $In_{0.52}Ga_{0.32}Zn_{0.15}O$, and a band gap of about 4.17 eV may be given to the barrier layer BAL having a thickness of about 2 nm and a composition ratio of $In_{0.38}Ga_{0.44}Zn_{0.18}O$. It may be understood that a band gap of an oxide semiconductor layer is increased with an increase in concentration of gallium. For example, a concentration of gallium contained in an oxide semiconductor layer including IGZO may be adjusted to control a difference in band gap between the confinement layer COL and the barrier layer BAL.

A work function of about 4.64 eV may be given to the confinement layer COL having a thickness of about 5 nm and a composition ratio of $In_{0.61}Ga_{0.16}Zn_{0.23}O$. A band gap of about 4.34 eV may be given to the barrier layer BAL having a thickness of about 2 nm and a composition ratio of $In_{0.46}Ga_{0.19}Zn_{0.34}O$, a band gap of about 4.39 eV may be given to the barrier layer BAL having a thickness of about 2 nm and a composition ratio of $In_{0.52}Ga_{0.32}Zn_{0.15}O$, and a band gap of about 4.54 eV may be given to the barrier layer BAL having a thickness of about 2 nm and a composition ratio of $In_{0.38}Ga_{0.44}Zn_{0.18}O$. An oxide semiconductor layer may have a work function that increases with an increase in concentration of gallium and a reduction in concentration of indium. Alternatively or additionally, an oxide semiconductor layer may have a work function that increases with an increase in thickness thereof.

In this sense a thickness and composition ratio of an oxide semiconductor layer are adjusted to control a band gap and work function of the oxide semiconductor layer.

Figure 5:
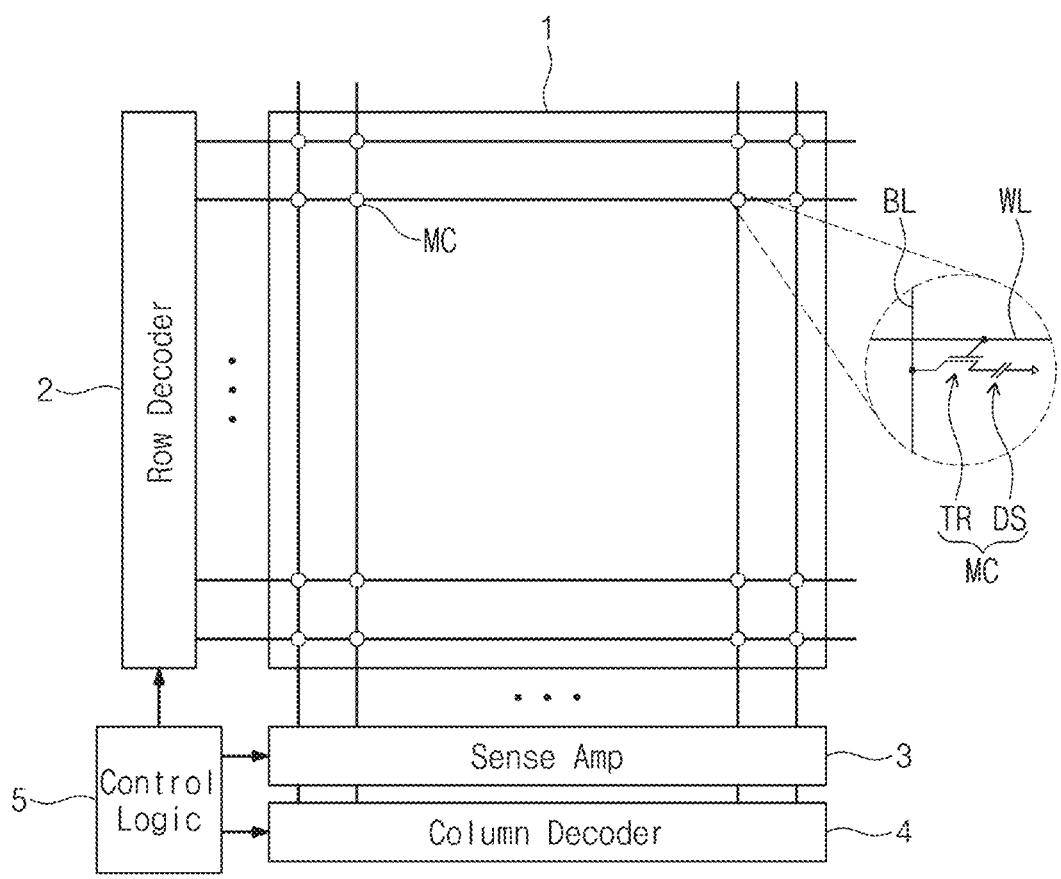
FIG. 5 illustrates a block diagram showing a semiconductor memory device including a semiconductor device according to some example embodiments of inventive concepts.

FIG. 5 illustrates a block diagram/schematic diagram showing a semiconductor memory device including a semiconductor device according to some example embodiments of inventive concepts.

Referring to FIG. 5, a semiconductor memory device may include a memory cell array 1, a row decoder 2, a sense amplifier 3, a column decoder 4, and a control logic 5.

The memory cell array 1 may include a plurality of memory cells MC that are arranged two-dimensionally or three-dimensionally. Each of the memory cells MC may be connected between a word line WL (e.g. a row) and a bit line BL (e.g. a column) that cross each other.

Each of the memory cells MC may include a selection element TR and a data storage element DS, wherein elements TR and DS may be electrically connected in series to each other. The selection element TR may be connected between the data storage element DS and the word line WL, and the data storage element DS may be connected through the selection element TR to the bit line BL. The selection element TR may be or may include a field effect transistor (FET), and the data storage element DS may be an active and/or passive device such as at least one of a capacitor, a magnetic tunnel junction pattern, or a variable resistor. For example, the selection element TR may include a transistor, whose gate electrode may be connected to the word line WL and whose source/drain terminals may be correspondingly connected to the bit line BL and the data storage element DS.

The row decoder 2 may decode an address that is externally input, and may select one of the word lines WL of the memory cell array 1. The address that is decoded in the row decoder 2 may be provided to a row driver (not shown), and in response to a control operation of control circuits, the row driver may provide a certain voltage, e.g. a voltage greater than a threshold voltage of the selection element TR, to a selected word line WL and each of non-selected word lines WL.

In response to an address that is decoded from the column decoder 4, the sense amplifier 3 may detect and amplify a voltage difference between a selected bit line BL and a reference bit line, and may then output the amplified voltage difference.

The column decoder 4 may provide a data delivery path between the sense amplifier 3 and an external device (e.g., a memory controller). The column decoder 4 may decode an address that is externally input and may select one of the bit lines BL e.g. based on the address.

The control logic 5 may generate control signals that control operations to write data to the memory cell array 1 and/or to read data from the memory cell array 1.

Figure 6:
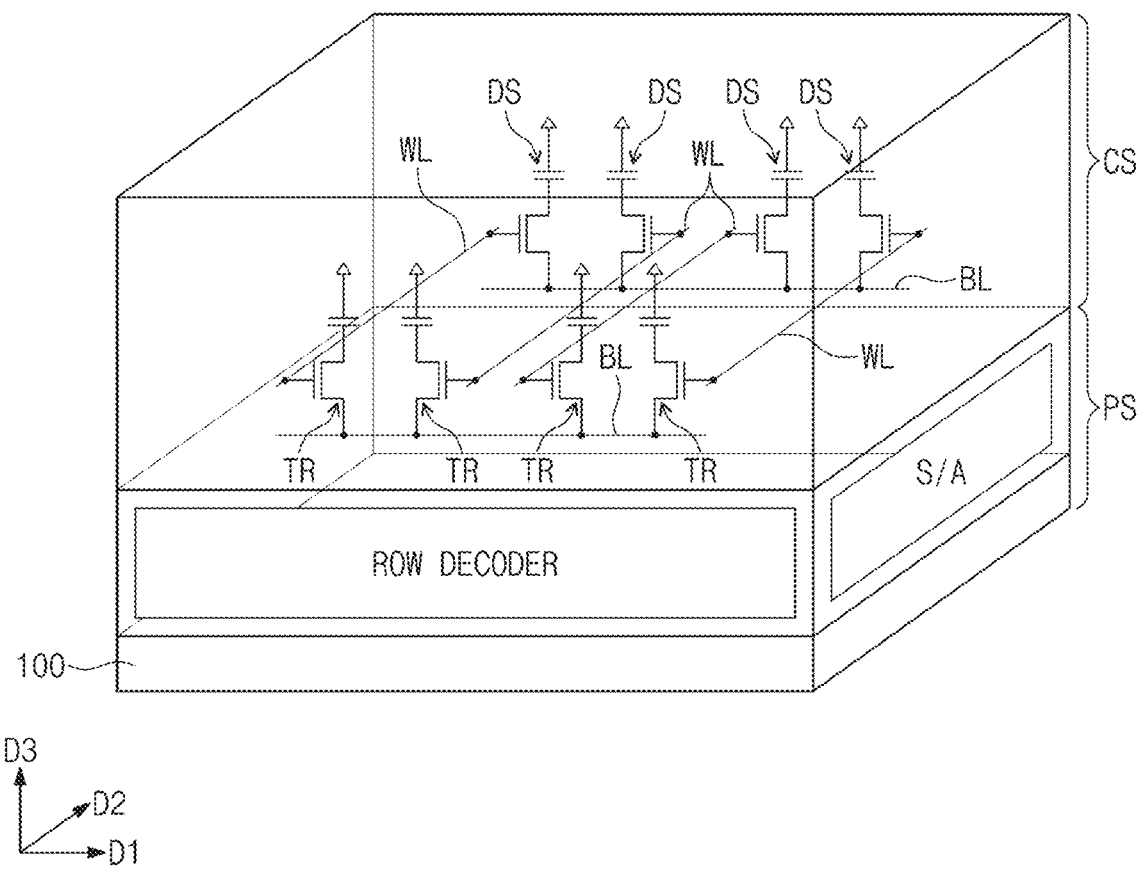
FIGS. 6 and 7 illustrate simplified perspective views showing a semiconductor memory device according to some example embodiments of inventive concepts.
Figure 7:
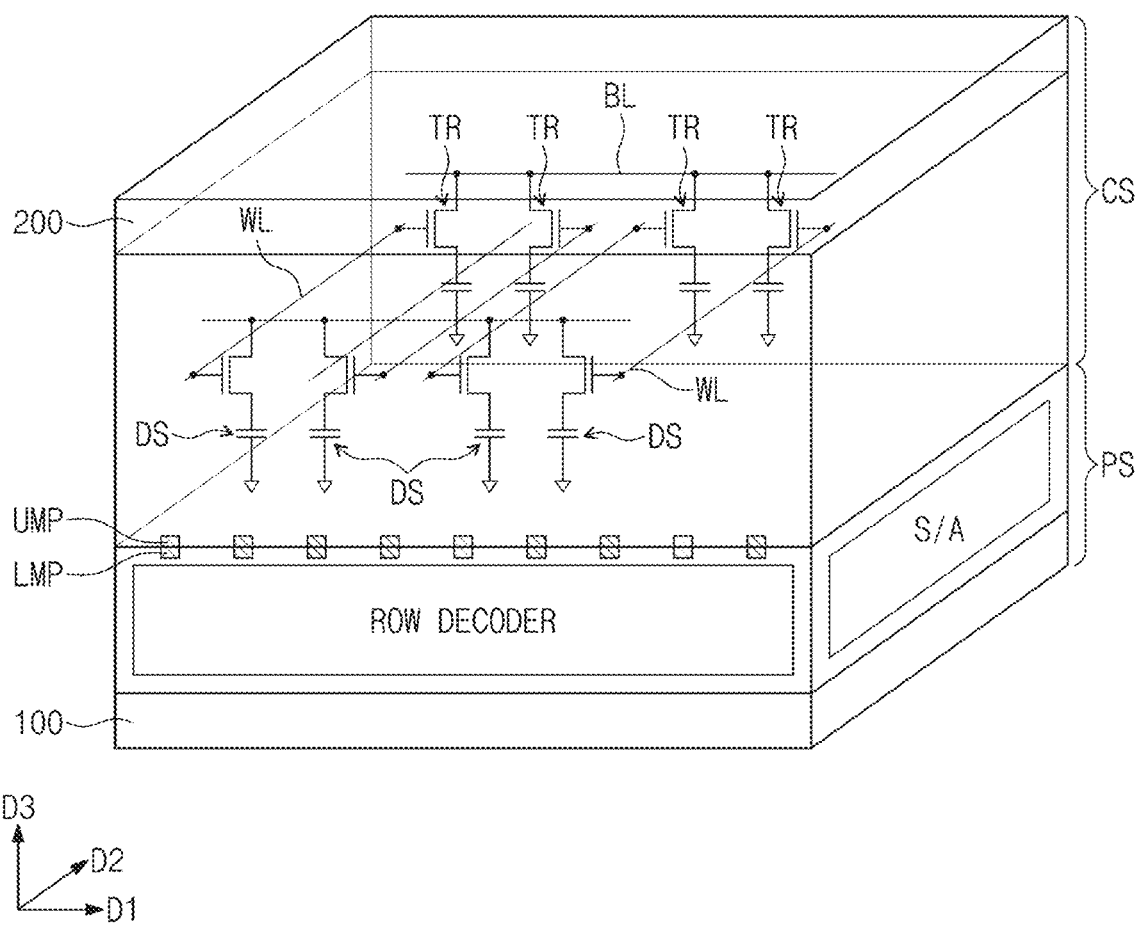

FIGS. 6 and 7 illustrate simplified perspective views showing a semiconductor memory device according to some example embodiments of inventive concepts.

Referring to FIGS. 6 and 7, a semiconductor memory device may include a peripheral circuit structure PS and a cell array structure CS connected to the peripheral circuit structure PS.

The peripheral circuit structure PS may include a core and peripheral circuits that are formed on a semiconductor substrate 100. The core and the peripheral circuits may include the row and column decoders (see 2 and 4 of FIG. 5), the sense amplifier (see 3 of FIG. 5), and the control logics (see 5 of FIG. 5).

The cell array structure CS may include the memory cell array (see 1 of FIG. 5) including the memory cells (see MC of FIG. 5) that are arranged two-dimensionally and/or three-dimensionally on a plane that extend in first and second directions D1 and D2 that intersect each other. Each of the memory cells (see MC of FIG. 5) may include, as discussed above, the selection element TR and the data storage element DS.

According to some example embodiments of inventive concepts, a vertical channel transistor (VCT) may be included as the selection transistor TR of each memory cell (see MC of FIG. 5). The vertical channel structure may have a structure where a channel length extends in a direction (or third direction D3) perpendicular to a top surface of the semiconductor substrate 100. In addition, a capacitor may be provided as the data storage element DS of each memory cell (see MC of FIG. 5).

According to some example embodiments, for example as illustrated in FIG. 6, the peripheral circuit structure PS may be provided on the semiconductor substrate 100, and the cell array structure CS may be provided on the peripheral circuit structure PS.

According to some example embodiments, for example as illustrated in FIG. 7, the peripheral circuit structure PS may be provided on the semiconductor substrate 100 (or first semiconductor substrate), and the cell array structure CS may be provided on a second semiconductor substrate 200.

The peripheral circuit structure PS may be provided on an uppermost layer with lower metal pads LMP. The lower metal pads LMP may be electrically connected to the core and the peripheral circuits (see 2, 3, 4, and 5 of FIG. 5).

The cell array structure CS may be provided on an uppermost layer with upper metal pads UMP. The upper metal pads UMP may be electrically connected to the memory cell array (see 1 of FIG. 5). The upper metal pads UMP may be directly contacted with or bonded to the lower metal pads LMP of the peripheral circuit structure PS.

Figure 8:
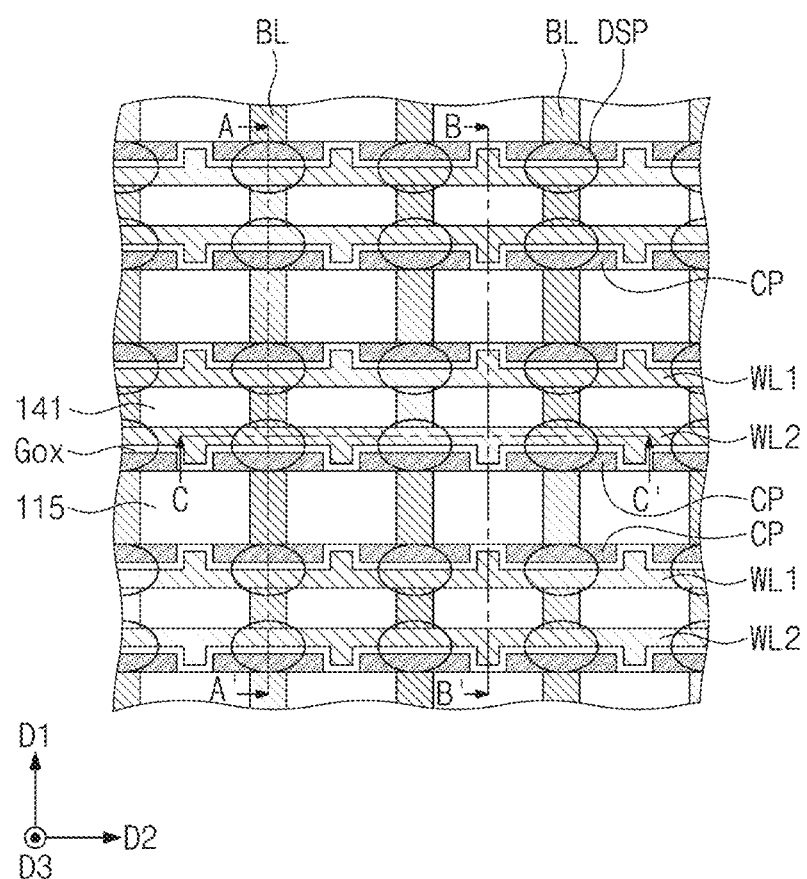
FIG. 8 illustrates a plan view showing a semiconductor memory device according to some example embodiments of inventive concepts.
Figure 9A:
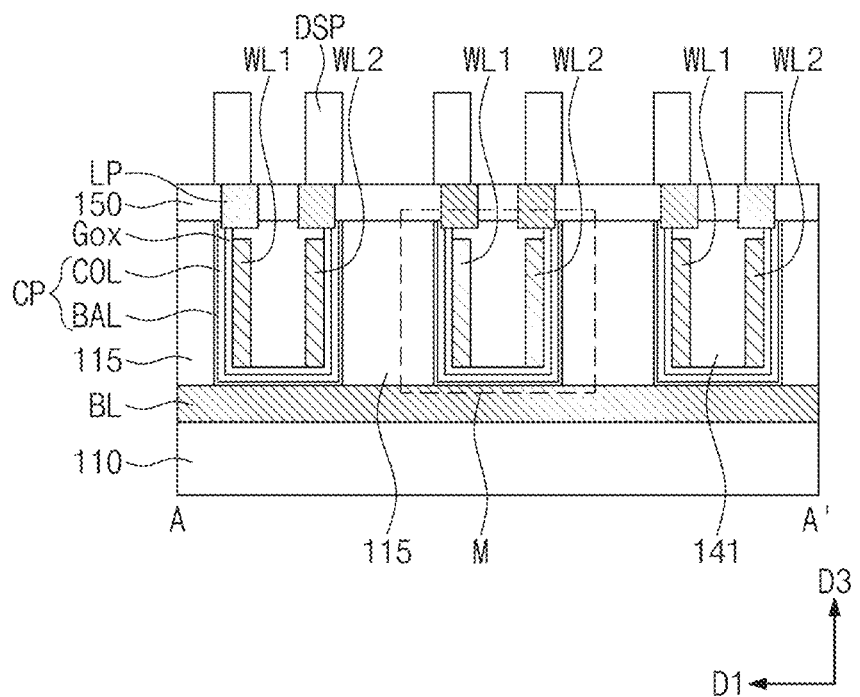
FIGS. 9A, 9B, and 9C illustrate cross-sectional views respectively taken along lines A-A', B-B', and C-C' of FIG. 8, showing a semiconductor memory device according to some example embodiments of inventive concepts.
Figure 9B:
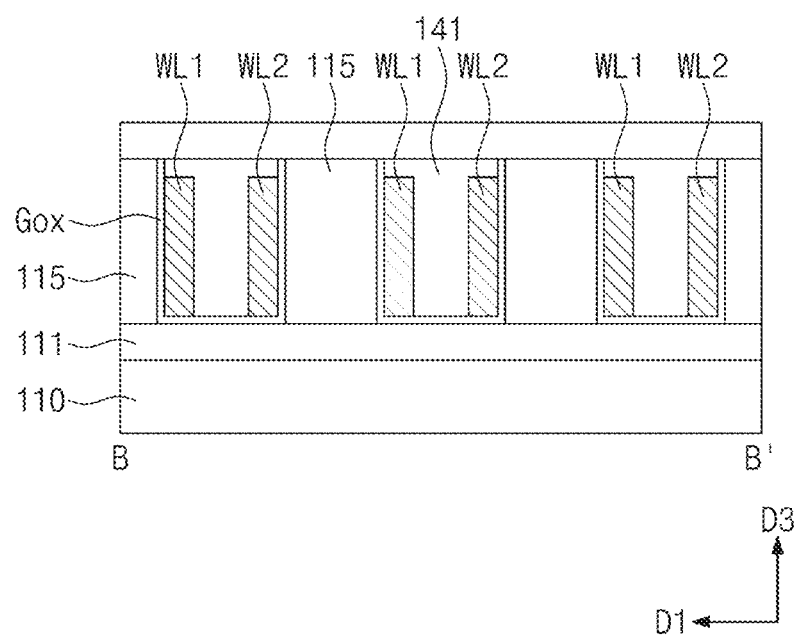
Figure 9C:
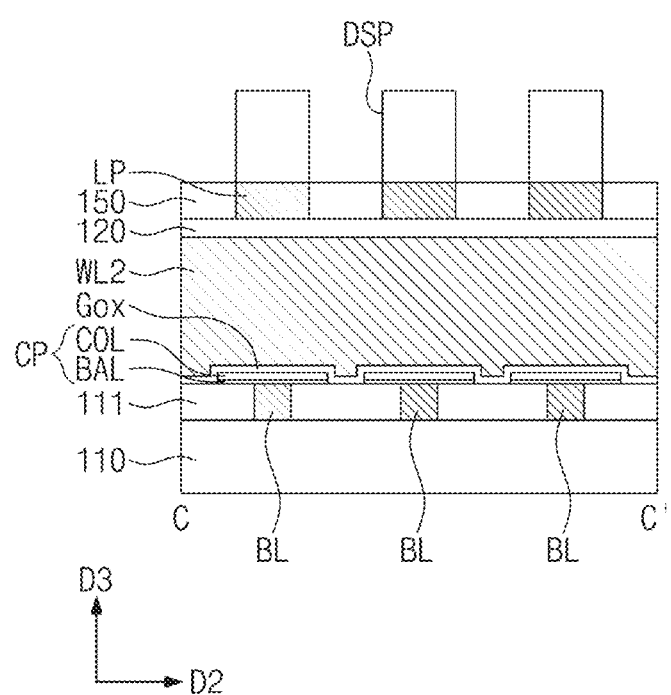

FIG. 8 illustrates a plan view showing a semiconductor memory device according to some example embodiments of inventive concepts. FIGS. 9A, 9B, and 9C illustrate cross-sectional views respectively taken along lines A-A', B-B', and C-C' of FIG. 8, showing a semiconductor memory device according to some example embodiments of inventive concepts. FIGS. 10A to 10D illustrate enlarged views showing section M of FIG. 9A.

Referring to FIGS. 8 and 9A to 9C, bit lines BL may extend in a first direction D1 on a lower dielectric layer 110, and may be spaced apart from each other in a second direction D2.

The bit lines BL may include, for example, doped polysilicon, metal, conductive metal nitride, conductive metal silicide, conductive metal oxide, or any combination thereof. The bit lines BL may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof, but inventive concepts are not limited thereto. The bit lines BL may include a single or multiple layer including the material discussed above. In some example embodiments, the bit lines BL may include a two-dimensional semiconductor material, such as graphene, carbon nano-tube, or any combination thereof.

A filling dielectric layer 111 may fill spaces between the bit lines BL. The filling dielectric layer 111 may include, for example, one or more of a silicon oxide layer, a silicon nitride layer, a silicon oxynitride layer, and a low-k dielectric layer.

A first dielectric pattern 115 may be located on the bit lines BL. The first dielectric pattern 115 may define trenches that extend in the second direction D2 to run across the bit lines BL and are spaced apart from each other in the first direction D1. The first dielectric pattern 115 may include, for example, one or more of a silicon oxide layer, a silicon nitride layer, a silicon oxynitride layer, and a low-k dielectric layer.

One or more channel patterns CP may be located in each trench defined by the first dielectric pattern 115. In each trench, the channel patterns CP may be located spaced apart from each other in the second direction D2. The channel patterns CP may be alternately arranged along the first direction D1 on each of the bit lines BL. For example, the channel patterns CP may be two-dimensionally arranged along the first and second directions D1 and D2 that intersect each other.

Each of the channel patterns CP may include a barrier layer BAL in contact with the bit line BL and a confinement layer COL on the barrier layer BAL. The barrier layer BAL and the confinement layer COL may each be called an oxide semiconductor layer. The barrier layer BAL and the confinement layer COL may be substantially the same as the barrier layer BAL and the confinement layer COL that are discussed with reference to FIGS. 1 to 4C.

A two-dimensional electron gas (2DEG) may be formed within the confinement layer COL. The two-dimensional electron gas (2DEG) may be formed in an inside of the confinement layer COL, and may be adjacent to an interface between the confinement layer COL and the barrier layer BAL.

The channel pattern CP may include an oxide semiconductor material. For example, the oxide semiconductor material may include $In_xGa_yZnzO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or any combination thereof. For example, the barrier layer BAL and the confinement layer COL may each include indium gallium zinc oxide (IGZO).

Figure 10A:
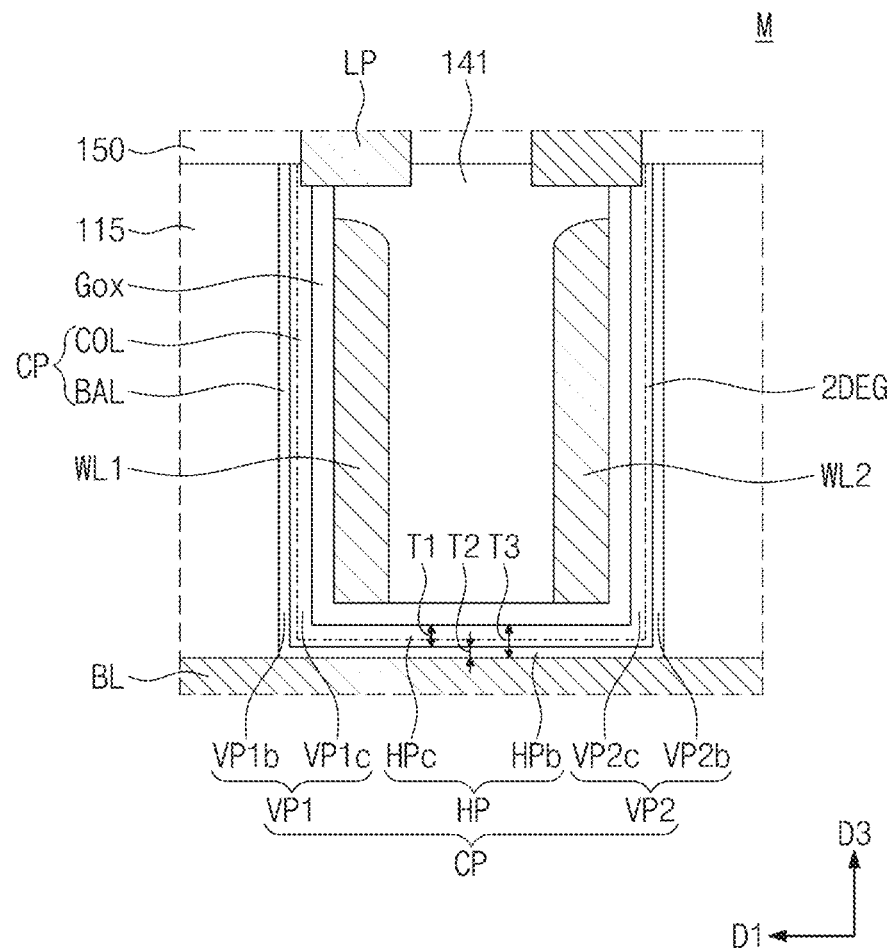
FIGS. 10A to 10D illustrate enlarged views showing section M of FIG. 9A.

With reference to FIG. 10A, the following description will focus on a detailed structure of the channel pattern CP. Each of the channel patterns CP may include a horizontal part HP located on the bit line BL, and may also include a first vertical part VP1 and a second vertical part VP2 that vertically protrude from the horizontal part HP and face each other in the first direction D1. The first and second vertical parts VP1 and VP2 may have a vertical length in a direction perpendicular to a top surface of the bit line BL, and may also have a width in the first direction D1.

The horizontal part HP of the channel pattern CP may be in direct contact with the top surface of the bit line BL. The horizontal part HP on the top surface of the bit line BL may have a thickness substantially the same as that of each of the first and second vertical parts VP1 and VP2 on a sidewall of the first dielectric pattern 115.

On each of the channel patterns CP, the horizontal part HP may include a common source/drain region, the first vertical part VP1 may include a first source/drain region at a top end thereof, and the second vertical part VP2 may include a second source/drain region at a top surface thereof. The first vertical part VP1 may include a first channel region between the first source/drain region and the common source/drain region, and the second vertical part VP2 may include a second channel region between the second source/drain region and the common source/drain region. The first channel region of the first vertical part VP1 may be controlled by a first word line WL1 which will be discussed below, and the second channel region of the second vertical part VP2 may be controlled by a second word line WL2 which will be discussed below.

The barrier layer BAL may include a horizontal part HPb, a first vertical part VP1*b*, and a second vertical part VP2*b*. Likewise the channel pattern CP, the horizontal part HPb of the barrier layer BAL may be in direct contact with the top surface of the bit line BL. The first and second vertical parts VP1*b* and VP2*b* of the barrier layer BAL may vertically protrude from the horizontal part HPb of the barrier layer BAL and may face each other in the first direction D1. The first and second vertical parts VP1*b* and VP2*b* of the barrier layer BAL may be in contact with the first dielectric pattern 115.

The confinement layer COL may include a horizontal part HPc, a first vertical part VP1*c*, and a second vertical part VP2*c*. The horizontal part HPc of the confinement layer COL may be in contact with the horizontal part HPb of the barrier layer BAL. The first and second vertical parts VP1*c* and VP2*c* of the confinement layer COL may vertically protrude from the horizontal part HPc of the confinement layer COL and may face each other in the first direction D1. The first and second vertical parts VP1*c* and VP2*c* of the confinement layer COL may be in contact with the first and second vertical parts VP1*b* and VP2*b* of the barrier layer BAL. The horizontal part HPc and the first and second vertical parts VP1*c* and VP2*c* of the confinement layer COL may be in contact with a gate dielectric pattern Gox which will be discussed below. The confinement layer COL may be interposed between the barrier layer BAL and a gate dielectric pattern Gox which will be discussed below.

The horizontal part HPb of the barrier layer BAL and the horizontal part HPc of the confinement layer COL may constitute/correspond to/be included in a horizontal part HP of the channel pattern CP. The first vertical part VP1b of the barrier layer BAL and the first vertical part VP1c of the confinement layer COL may constitute/correspond to/be included in a first vertical part VP1 of the channel pattern CP. The second vertical part VP2b of the barrier layer BAL and the second vertical part VP2c of the confinement layer COL may constitute/correspond to/be included in a second vertical part VP2 of the channel pattern CP.

A first thickness T1 may be defined to indicate a thickness of the confinement layer COL, e.g. within the horizontal part HP. A second thickness T2 may be defined to indicate a thickness of the barrier layer BAL, e.g. within the horizontal part HP. A third thickness T3 may be defined to indicate a thickness of the channel pattern CP, e.g. within the horizontal part HP. The third thickness T3 may be a sum of the first thickness T1 and the second thickness T2. The first thickness T1 may be greater than the second thickness T2. For example, the second thickness T2 may range from about 1 nm to about 3 nm, and the first thickness T1 may range from about 3 nm to about 7 nm, and may or may not vary between the horizontal part HP and the first and second vertical parts VP1 and VP2. The third thickness T3 may range from about 4 nm to about 10 nm, and may or may not vary between the horizontal part HP and the first and second vertical parts VP1 and VP2.

Alternatively or additionally, a concentration of gallium (Ga) in the confinement layer COL may be less than that in the barrier layer BAL. A concentration of indium (In) in the confinement layer COL may be greater than that in the barrier layer BAL. For example, the confinement layer COL may include indium gallium zinc oxide (IGZO), which may have a composition ratio of $In_{0.61}Ga_{0.16}Zn_{0.23}O$, and the barrier layer BAL may include IGZO, which may have a composition ratio of $In_{0.38}Ga_{0.44}Zn_{0.18}O$, $In_{0.52}Ga_{0.32}Zn_{0.15}O$, or $In_{0.46}Ga_{0.19}Zn_{0.34}O$.

Alternatively or additionally, the confinement layer COL may have a band gap less than that of the barrier layer BAL. For example, when the confinement layer COL whose thickness is about 5 nm has a composition ratio of $In_{0.61}Ga_{0.16}Zn_{0.23}O$, the confinement layer COL may have a band gap of about 3.59 eV, and when the barrier layer BAL whose thickness is about 2 nm has a composition ratio of $In_{0.46}Ga_{0.19}Zn_{0.34}O$, the barrier layer BAL may have a band gap of about 4.02 eV. An oxide semiconductor layer may have a band gap that increases with an increase in concentration of gallium.

Alternatively or additionally, the confinement layer COL may have a work function greater than that of the barrier layer BAL. For example, when the confinement layer COL whose thickness is about 5 nm has a composition ratio of $In_{0.61}Ga_{0.16}Zn_{0.23}O$, the confinement layer COL may have a work function of about 4.64 eV, and when the barrier layer BAL whose thickness is about 2 nm has a composition ratio of $In_{0.46}Ga_{0.19}Zn_{0.34}O$, the barrier layer BAL may have a work function of about 4.34 eV. An oxide semiconductor layer may have a work function that increases with an increase in concentration of gallium and a reduction in concentration of indium. In addition, an oxide semiconductor layer may have a work function that increases with an increase in thickness thereof.

The greater difference in work function between the confinement layer COL and the barrier layer BAL, the higher electron mobility in the channel pattern CP. Therefore, in order to improve electrical properties of a semiconductor device, it may be important to control the work functions of the confinement layer COL and the barrier layer BAL. The difference in work function may be increased by controlling a thickness of each of the confinement layer COL and the barrier layer BAL and a composition ratio of each of oxide semiconductor materials included in the confinement layer COL and the barrier layer BAL.

Each of first and second word lines WL1 and WL2 may have an inner sidewall and an outer sidewall that faces the inner sidewall, and the inner walls of the first and second word lines WL1 and WL2 may be located to face each other on the horizontal part HP. The outer sidewall of the first word line WL1 may be adjacent to an inner sidewall of the first vertical part VP1, and the outer sidewall of the second word line WL2 may be adjacent to an inner sidewall of the second vertical part VP2. The first word line WL1 may be adjacent to the first channel region of the first vertical part VP1, and the second word line WL2 may be adjacent to the second channel region of the second vertical part VP2. The first and second word lines WL1 and WL2 may have either or both of their top surfaces at a lower level than either or both of top surfaces of the first and second vertical parts VP1 and VP2 included in the channel patterns CP. In addition, the first and second word lines WL1 and WL2 may each have a spacer shape. For example, the first and second word lines WL1 and WL2 may have their rounded top surfaces.

Either or both of the first and second word lines WL1 and WL2 may include, for example, doped polysilicon, metal, conductive metal nitride, conductive metal silicide, conductive metal oxide, or any combination thereof. Either or both of the first and second word lines WL1 and WL2 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof, but inventive concepts are not limited thereto. Either or both of the first and second word lines WL1 and WL2 may include a single or multiple layer including the material discussed above. In some example embodiments, either or both of the first and second word lines WL1 and WL2 may include a two-dimensional semiconductor material, such as graphene, carbon nano-tube, or any combination thereof.

A gate dielectric pattern Gox may be located between the first word line WL1 and the channel pattern CP, and between the second word line WL2 and the channel pattern CP. The gate dielectric pattern Gox may have a uniform thickness to cover a surface of the channel pattern CP. Within the channel pattern CP, the gate dielectric pattern Gox may be in direct contact with a top surface of the lower dielectric layer 110 and sidewalls of the first dielectric pattern 115.

The gate dielectric pattern Gox may be interposed between the horizontal part HP of the channel pattern CP and bottom surfaces of the first and second word lines WL1 and WL2, between the outer sidewall of the first word line WL1 and the inner sidewall of the first vertical part VP1, and between the outer sidewall of the second word line WL2 and the inner sidewall of the second vertical part VP2.

The gate dielectric pattern Gox may be formed of/include a silicon oxide layer, a silicon oxynitride layer, a high-k dielectric layer whose dielectric constant is greater than that of a silicon oxide layer, or any combination thereof. The high-k dielectric layer may be formed of metal oxide or metal oxynitride. For example, the high-k dielectric layer possibly used as the gate dielectric pattern Gox may be formed of $HfO_2$, HfSiO, HfSiON, HfTaO, HfSiO, HfZrO, $ZrO_2$, $Al_2O_3$, or any combination thereof, but inventive concepts are not limited thereto.

A second dielectric pattern 141 may fill spaces between the first and second word lines WL1 and WL2 that are adjacent to each other. The second dielectric pattern 141 may cover the top surfaces of the first and second word lines WL1 and WL2. The second dielectric pattern 141 may have a top surface substantially coplanar with those of the first and second vertical parts VP1 and VP2 included in the channel pattern CP. The top surface of the second dielectric pattern 141 may be substantially coplanar with that of the first dielectric pattern 115. The second dielectric pattern 141 may include, for example, one or more of a silicon oxide layer, a silicon nitride layer, a silicon oxynitride layer, and a low-k dielectric layer.

Landing pads LP may be correspondingly located on the first and second vertical parts VP1 and VP2 of the channel pattern CP. The landing pads LP may be in direct contact with the first and second vertical parts VP1 and VP2. The landing pads LP may each have a circular shape, an oval shape, a rectangular shape, a square shape, a rhombic shape, a hexagonal shape, or any other suitable shape.

The landing pads LP may be formed of/include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof, but inventive concepts are not limited thereto.

The first and second dielectric patterns 115 and 141 may be provided thereon with an interlayer dielectric layer 150 that fills spaces between the landing pads LP.

Data storage patterns DSP may be located on corresponding landing pads LP. The data storage patterns DSP may be correspondingly electrically connected through the landing pads LP to the first and second vertical parts VP1 and VP2 of the channel patterns CP. The data storage patterns DSP may be arranged in a matrix shape along the first and second directions D1 and D2.

According to some example embodiments, the data storage patterns DSP may be or include capacitors, each of which capacitors may include a bottom electrode, a top electrode, and a capacitor dielectric layer interposed between the bottom and top electrodes. In this case, the bottom electrode may contact the landing pad LP, and may have a circular shape, an oval shape, a rectangular shape, a square shape, a rhombic shape, a hexagonal shape, or any other suitable shape.

Alternatively or additionally, the data storage patterns DSP may be a variable resistance pattern that is switched from one to the other of its two resistance states by an applied electrical pulse. For example, the data storage patterns DSP may include a phase-change material whose crystalline state is changed based on an amount of current, perovskite compounds, transition metal oxide, magnetic materials, ferromagnetic materials, or antiferromagnetic materials.

Figure 10B:
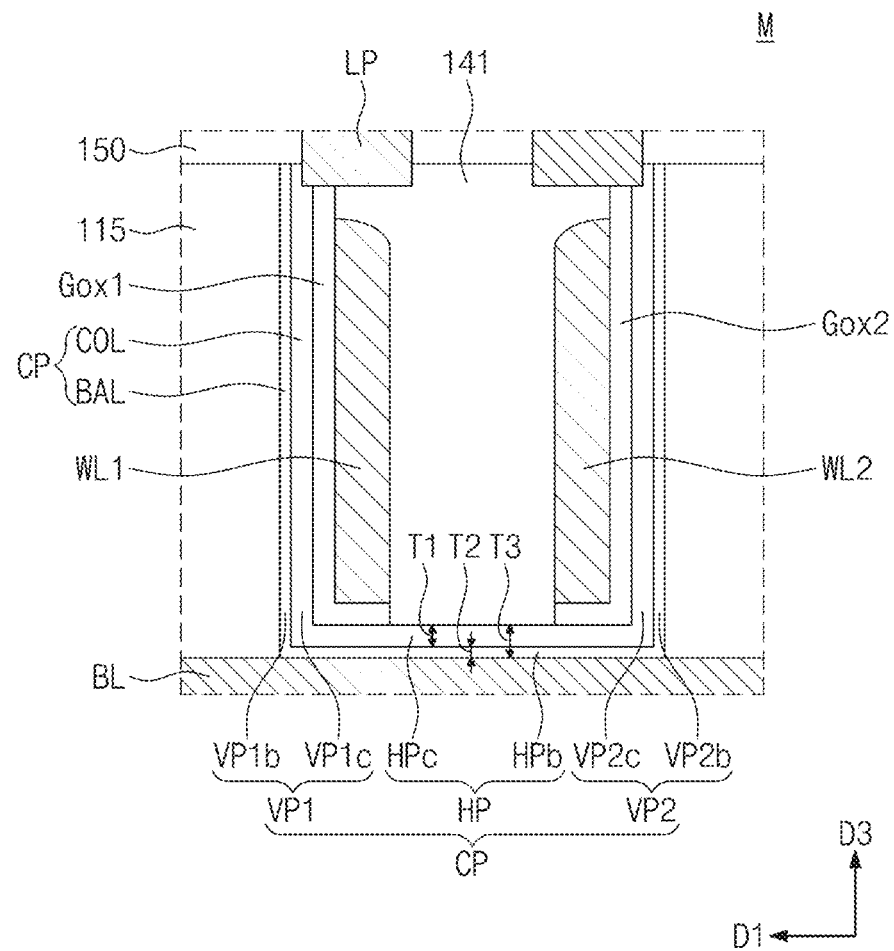

Referring to FIG. 10B, first and second gate dielectric patterns Gox1 and Gox2 may be located which are separated from each other on the horizontal part HP of the channel pattern CP. The first gate dielectric pattern Gox1 may be interposed between the bottom surface of the first word line WL1 and the horizontal part HP of the channel pattern CP and between the outer sidewall of the first word line WL1 and the first vertical part VP1 of the channel pattern CP. The second gate dielectric pattern Gox2 may be interposed between the bottom surface of the second word line WL2 and the horizontal part HP of the channel pattern CP and between the outer sidewall of the second word line WL2 and the second vertical part VP2 of the channel pattern CP. The first gate dielectric pattern Gox1 may be located symmetrically in the first direction D1 with the second gate dielectric pattern Gox2. The horizontal part HP of the channel pattern CP may be in contact with the second dielectric pattern 141 between the first and second word lines WL1 and WL2. The first and second gate dielectric patterns Gox1 and Gox2 may have their lower sidewalls aligned with corresponding sidewalls of the first and second word lines WL1 and WL2. The second dielectric pattern 141 may cover the lower sidewalls of the first and second gate dielectric patterns Gox1 and Gox2.

Figure 10C:
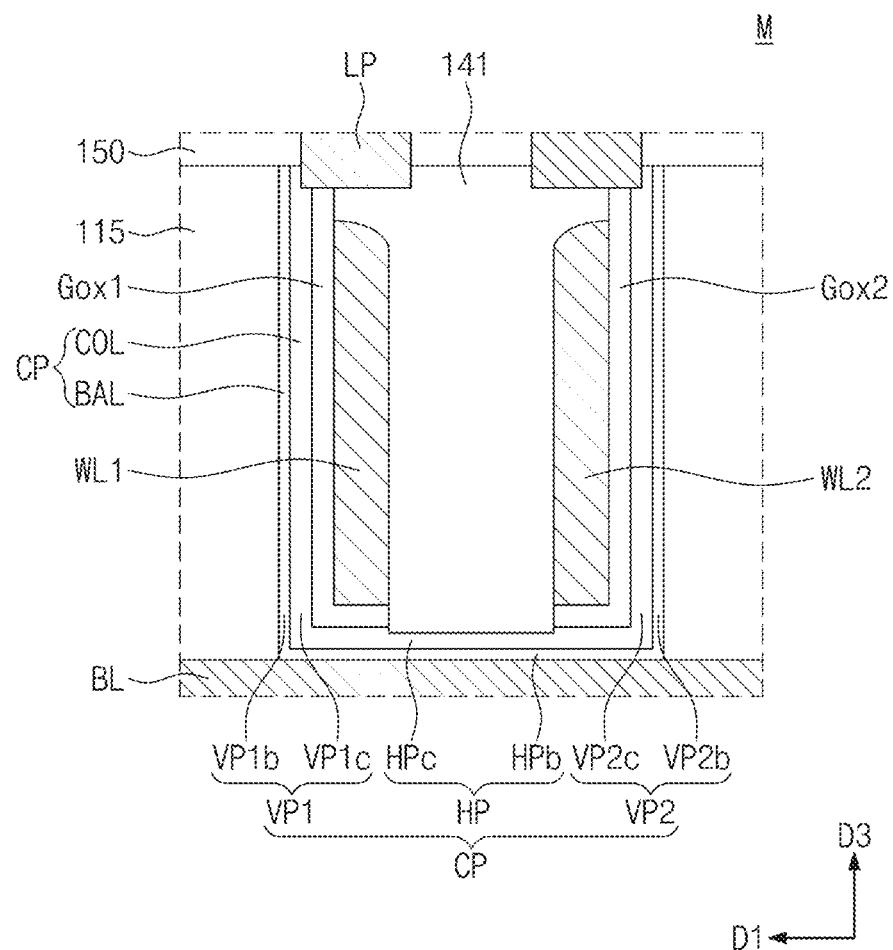

Referring to FIG. 10C, the first and second gate dielectric patterns Gox1 and Gox2 may be spaced apart from each other on the horizontal part HP of the channel pattern CP. The horizontal part HP of the channel pattern CP may have a thickness that is less between the first and second gate dielectric patterns Gox1 and Gox2 than below the first and second gate dielectric patterns Gox1 and Gox2.

Figure 10D:
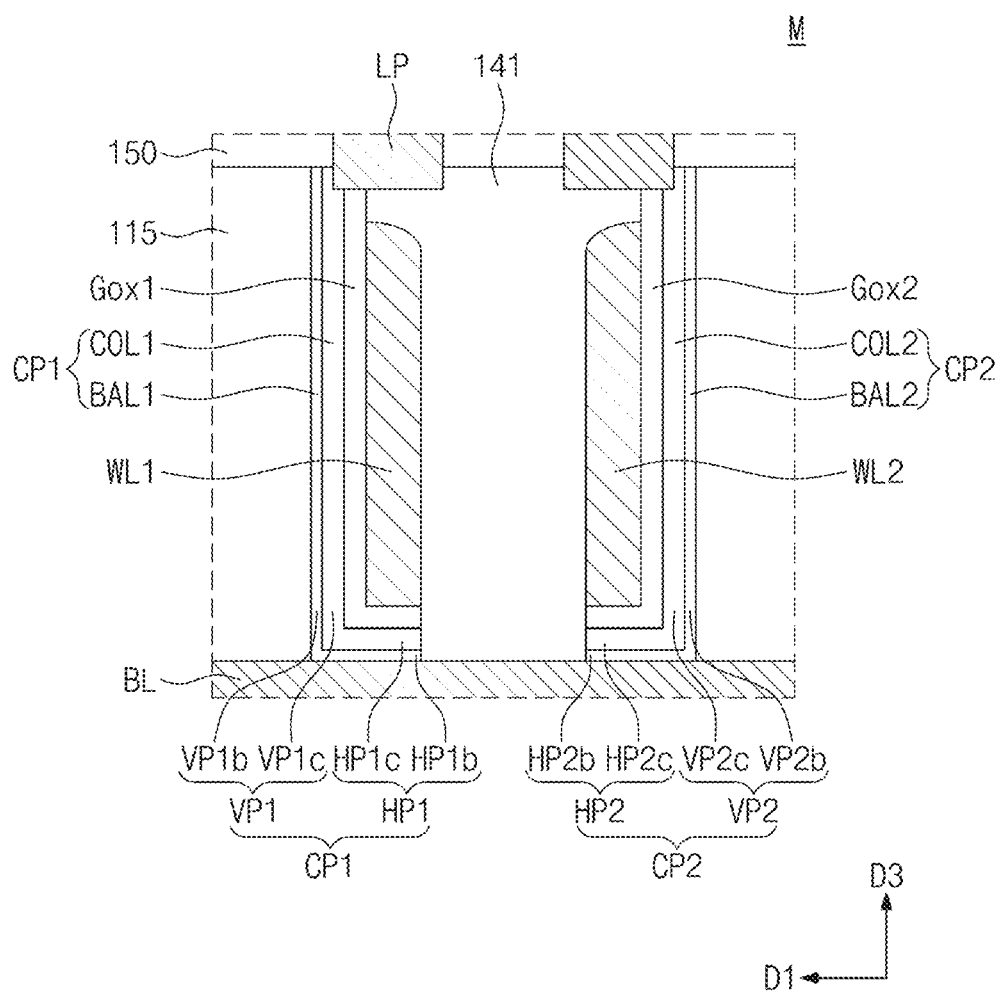

Referring to FIG. 10D, the bit line BL may be provided thereon with first and second channel patterns CP1 and CP2 that are spaced apart from and symmetrical with each other in the first direction D1. The first channel pattern CP1 may include a first horizontal part HP1 in contact with the bit line BL, and may also include a first vertical part VP1 adjacent to the outer sidewall of the first word line WL1 while vertically protruding from the first horizontal part HP1. The second channel pattern CP2 may include a second horizontal part HP2 in contact with the bit line BL, and may also include a second vertical part VP2 adjacent to the outer sidewall of the second word line WL2 while vertically protruding from the second horizontal part HP2.

The first channel pattern CP1 may include a first barrier layer BAL1 and a first confinement layer COL1. The first barrier layer BAL1 may include a horizontal part HP1$b$ in contact with the bit line BL and a first vertical part VP1$b$ that vertically protrudes from the horizontal part HP1$b$. The first confinement layer COL1 may include a horizontal part HP1$c$ parallel to the bit line BL and a first vertical part VP1$c$ that vertically protrudes from the horizontal part HP1$c$.

The second channel pattern CP2 may include a second barrier layer BAL2 and a second confinement layer COL2. The second barrier layer BAL2 may include a horizontal part HP2$b$ in contact with the bit line BL and a second vertical part VP2$b$ that vertically protrudes from the horizontal part HP2$b$. The second confinement layer COL2 may include a horizontal part HP2$c$ parallel to the bit line BL and a second vertical part VP2$c$ that vertically protrudes from the horizontal part HP2$c$. The first and second channel patterns CP1 and CP2 may have their lower sidewalls aligned with corresponding sidewalls of the first and second word lines WL1 and WL2, and likewise the first and second gate dielectric patterns Gox1 and Gox2 may have their sidewalls aligned with corresponding sidewalls of the first and second word lines WL1 and WL2. The second dielectric pattern 141 may cover the lower sidewalls of the first and second channel patterns CP1 and CP2 and the lower sidewalls of the first and second gate dielectric patterns Gox1 and Gox2, and may contact the top surface of the bit line BL.

Figure 11:
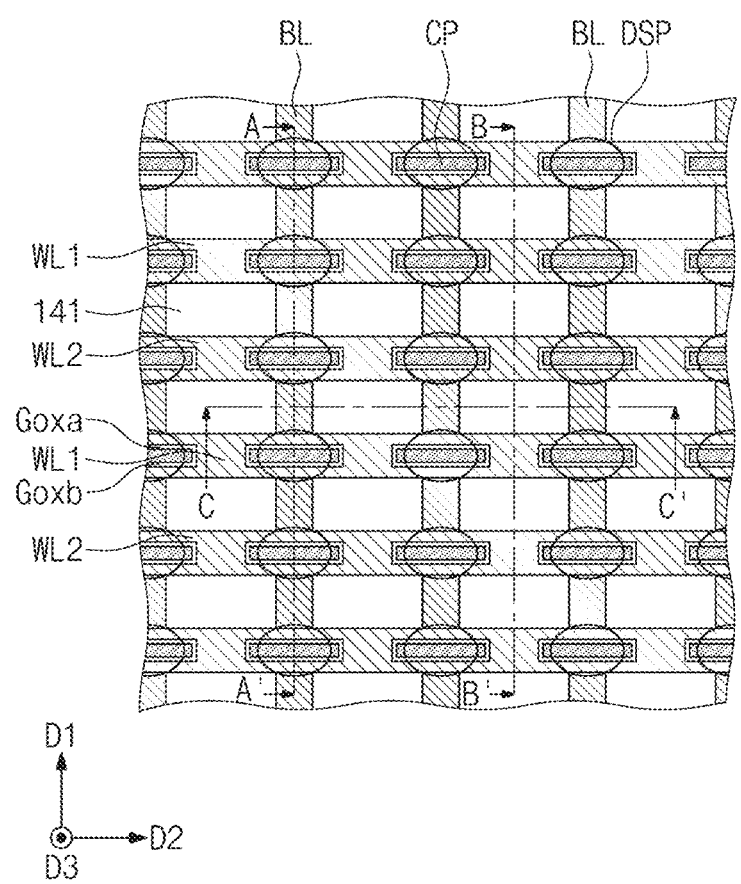
FIG. 11 illustrates a plan view showing a semiconductor memory device according to some example embodiments of inventive concepts.
Figure 12A:
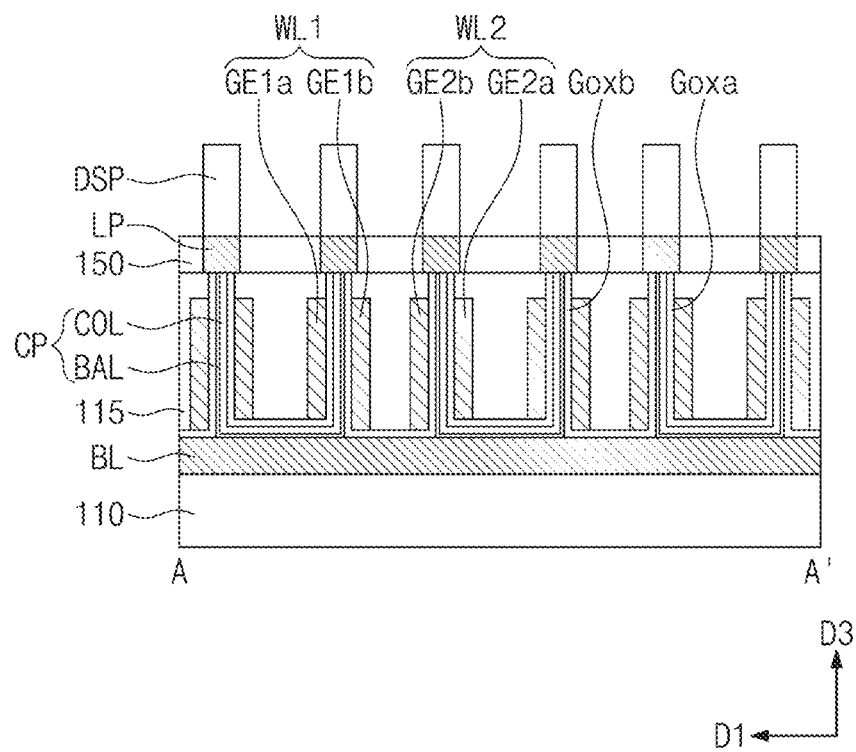
FIGS. 12A, 12B, and 12C illustrate cross-sectional views respectively taken along lines A-A', B-B', and C-C' of FIG. 11, showing a semiconductor memory device according to some example embodiments of inventive concepts.
Figure 12B:
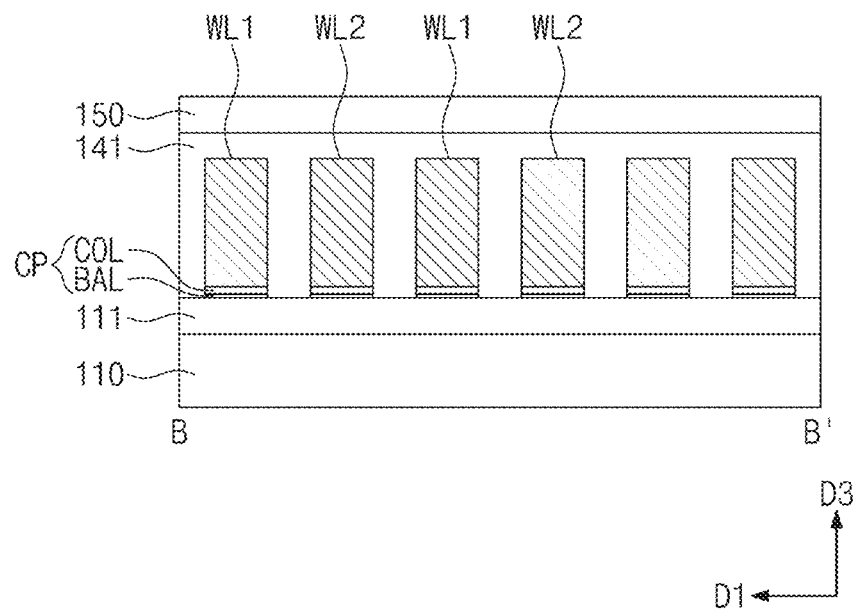
Figure 12C:
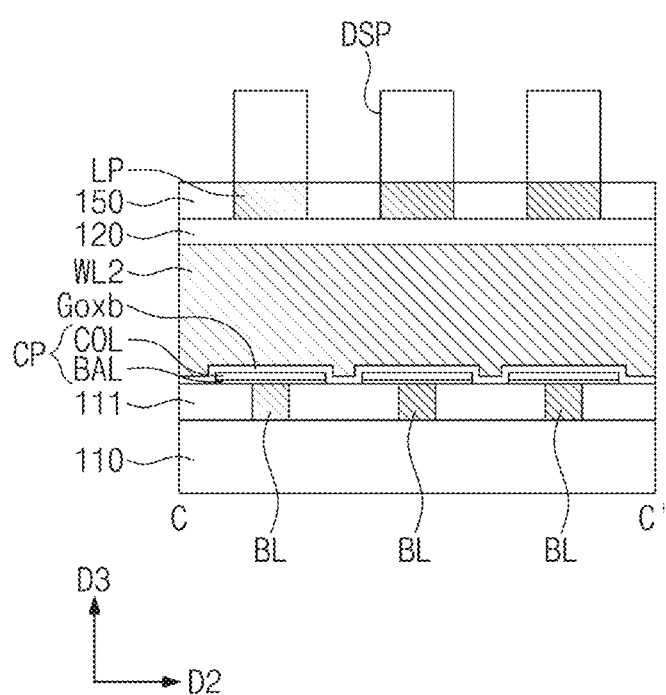

FIG. 11 illustrates a plan view showing a semiconductor memory device according to some example embodiments of inventive concepts. FIGS. 12A, 12B, and 12C illustrate cross-sectional views respectively taken along lines A-A', B-B', and C-C' of FIG. 11, showing a semiconductor memory device according to some example embodiments of inventive concepts. An explanation discussed above will be omitted, and a difference will be described in detail. Hereinafter, some example embodiments of inventive concepts will be discussed in detail also with reference to FIGS. 10A to 10D.

Referring to FIGS. 11 and 12A to 12C, as discussed above with reference to FIGS. 10A to 10D, the channel patterns CP may each include a horizontal part HP located on the bit line BL, and may also include first and second vertical parts VP1 and VP2 that vertically protrude from the horizontal part HP and face each other in the first direction D1.

The first and second word lines WL1 and WL2 may extend in the second direction D2 to run across the bit lines BL and be alternately arranged along the first direction D1. Each of the first word lines WL1 may extend while surrounding the first vertical parts VP1 of the channel patterns CP that are arranged along the second direction D2. Each of the second word lines WL2 may extend while surrounding the second vertical parts VP2 of the channel patterns CP that are arranged along the second direction D2.

In some example embodiments, each of the first word lines WL1 may include a first inner gate electrode GE1a and a first outer gate electrode GE1b, and each of the second word lines WL2 may include a second inner gate electrode GE2a and a second outer gate electrode GE2b.

The first inner gate electrode GE1a may be adjacent to the inner sidewall of the first vertical part VP1 of the channel pattern CP, and the first outer gate electrode GE1b may be adjacent to the outer sidewall of the first vertical part VP1 of the channel pattern CP. The second inner gate electrode GE2a may be adjacent to the inner sidewall of the second vertical part VP2 of the channel pattern CP, and the second outer gate electrode GE2b may be adjacent to the outer sidewall of the second vertical part VP2 of the channel pattern CP.

A single first vertical part VP1 may be located between the first inner gate electrode GE1a and the first outer gate electrode GE1b, and a single second vertical part VP2 may be located between the second inner gate electrode GE2a and the second outer gate electrode GE2b. In this sense, a semiconductor memory device may have a double gate transistor structure.

An inner gate dielectric pattern Goxa may have a uniform thickness to cover an inner sidewall of the channel pattern CP, and an outer gate dielectric pattern Goxb may have a uniform thickness to cover an outer sidewall of the channel pattern CP. For example, the inner gate dielectric pattern Goxa may be interposed between the horizontal part HP of the channel pattern CP and bottom surfaces of the first and second inner gate electrodes GE1a and GE2a, between the first vertical part VP1 and an outer sidewall of the first inner gate electrode GE1a, and between the second vertical part VP2 and an outer sidewall of the second inner gate electrode GE2a. The outer gate dielectric pattern Goxb may be interposed between the bit line BL and bottom surfaces of the first and second outer gate electrodes GE1b and GE2b that are adjacent to each other, between the first vertical part VP1 and one sidewall of the first outer gate electrode GE1b, and between the second vertical part VP2 and one sidewall of the second outer gate electrode GE2b. The outer gate dielectric pattern Goxb may be in contact with the bit line BL between the first and second outer gate electrodes GE1b and GE2b that are adjacent to each other.

The first inner and outer gate electrodes GE1a and GE1b may be connected to each other between the first vertical parts VP1 that are arranged along the second direction D2. The second inner and outer gate electrodes GE2a and GE2b may be connected to each other between the second vertical parts VP2 that are arranged along the second direction D2.

The second dielectric patterns 141 may fill spaces between the first and second inner gate electrodes GE1a and GE2a and between the first and second outer gate electrodes GE1b and GE2b. The second dielectric patterns 141 may have top surfaces at substantially the same level as that of the top surfaces of the first and second vertical parts VP1 and VP2.

The landing pads LP and the data storage patterns DSP may be correspondingly located on the first and second vertical parts VP1 and VP2 of the channel patterns CP. Each data storage pattern DSP may overlap the first inner and outer gate electrodes GE1a and GE1b or the second inner and outer gate electrodes GE2a and GE2b.

The landing pads LP and the data storage patterns DSP may be correspondingly located on centers of the first and second vertical parts VP1 and VP2, and may be arranged in a matrix shape when viewed in plan.

Figure 13:
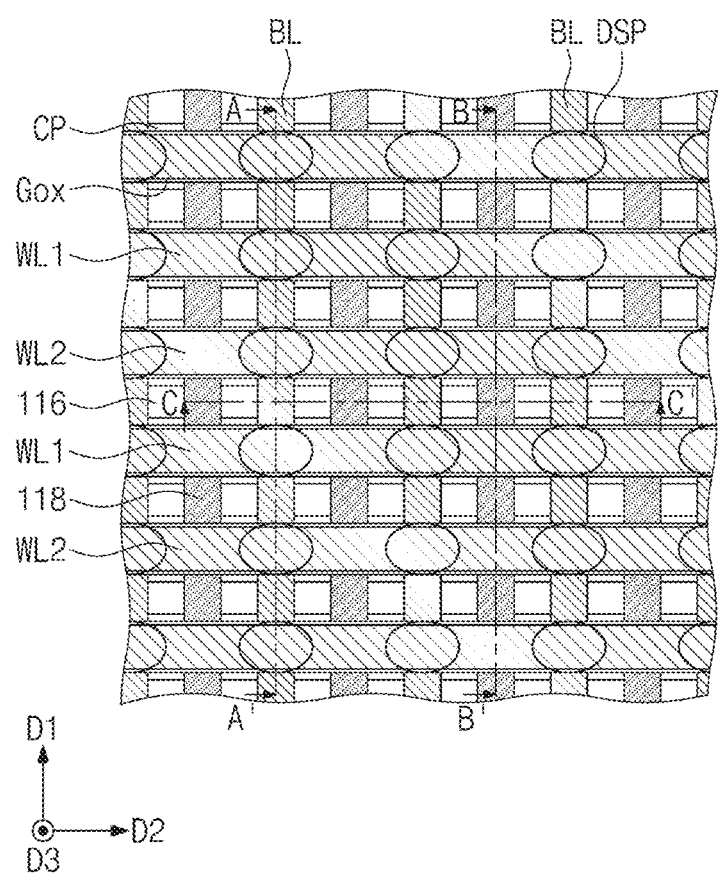
FIG. 13 illustrates a plan view showing a semiconductor memory device according to some example embodiments of inventive concepts.
Figure 14A:
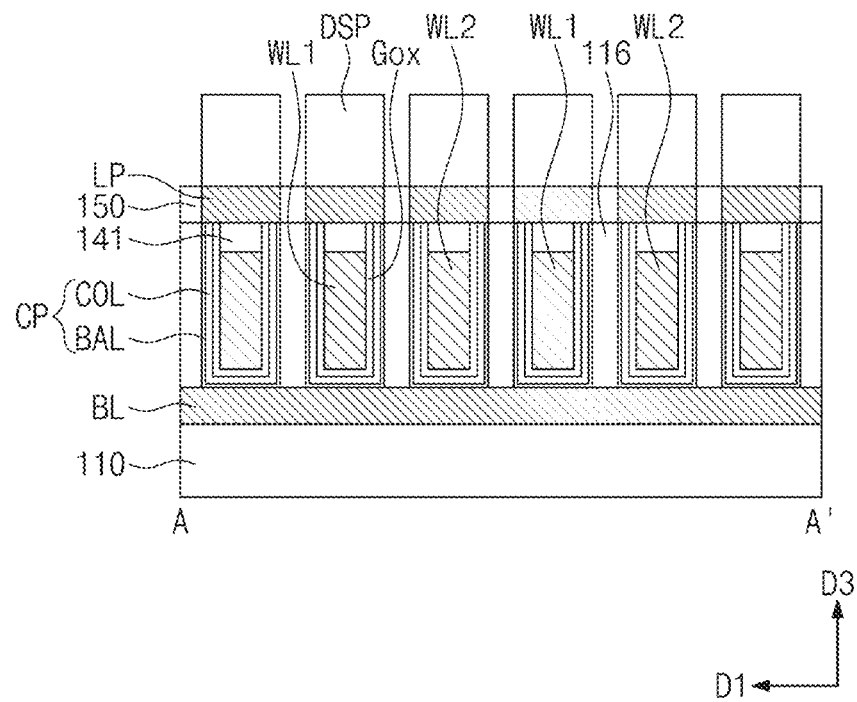
FIGS. 14A, 14B, and 14C illustrate cross-sectional views respectively taken along lines A-A', B-B', and C-C' of FIG. 13, showing a semiconductor memory device according to some example embodiments of inventive concepts.
Figure 14B:
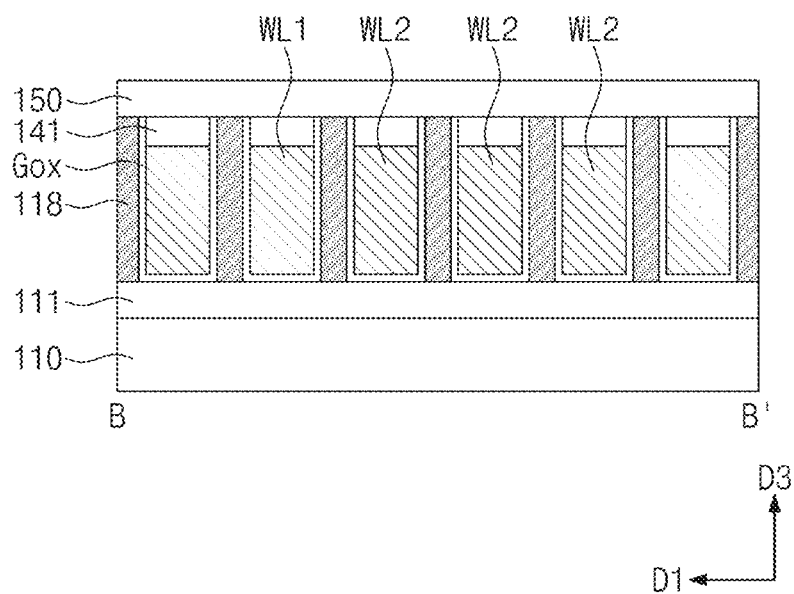
Figure 14C:
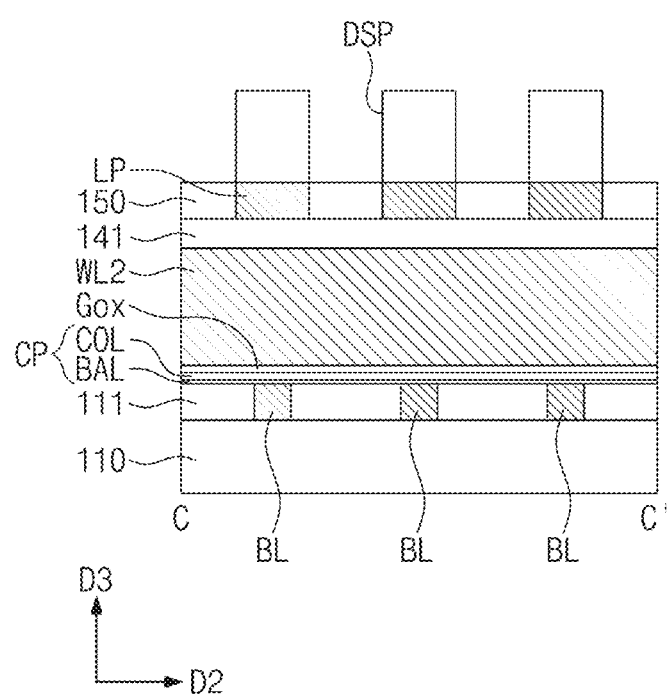

FIG. 13 illustrates a plan view showing a semiconductor memory device according to some example embodiments of inventive concepts. FIGS. 14A, 14B, and 14C illustrate cross-sectional views respectively taken along lines A-A', B-B', and C-C' of FIG. 13, showing a semiconductor memory device according to some example embodiments of inventive concepts. An explanation discussed above will be omitted, and a difference will be described in detail. Hereinafter, some example embodiments of inventive concepts will be discussed in detail also with reference to FIGS. 10A to 10D.

Referring to FIGS. 13 and 14A to 14C, the first and second word lines WL1 and WL2 may extend in the second direction D2 on the bit lines BL. The first and second word lines WL1 and WL2 may be alternately arranged in the first direction D1.

The channel patterns CP may be correspondingly located between the bit lines BL and the first and second word lines WL1 and WL2. The channel patterns CP may be disposed spaced apart from each other in the first direction D1 on each bit line BL. As discussed above, each of the channel patterns CP may include first and second vertical parts VP1 and VP2 that face each other and a horizontal part HP that connects the first vertical part VP1 to the second vertical part VP2. The horizontal part HP may be in contact with the top surface of the bit line BL, and the first and second vertical parts VP1 and VP2 may be adjacent to opposite sidewalls of the first word line WL1 or the second word line WL2. The second dielectric pattern 141 may be located on the top surface of each of the first and second word lines WL1 and WL2. The top surfaces of the first and second word lines WL1 and WL2 may be located at a level lower than that of the top surfaces of the first and second vertical parts VP1 and VP2 included in the channel patterns CP. According to the some example embodiments, the first and second vertical parts VP1 and VP2 of each channel pattern CP may have channel regions that are commonly controlled by the first word line WL1 or the second word line WL2.

The gate dielectric pattern Gox may be interposed between the channel pattern CP and the bottom surface and each of the first and second word lines WL1 and WL2 and between the channel pattern CP and the opposite sidewalls of each of the first and second word lines WL1 and WL2. The gate dielectric pattern Gox may be in directly contact with the opposite sidewalls and the bottom surface of each of the first and second word lines WL1 and WL2.

Third dielectric patterns 116 may separate the channel patterns CP from each other in the first direction D1, and fourth dielectric patterns 118 may separate the channel patterns CP from each other in the second direction D2. The first and second vertical parts VP1 and VP2 of the channel patterns CP may have their top surfaces at substantially the same level as that of top surfaces of the third and fourth dielectric patterns 116 and 118.

The landing pads LP may be provided on corresponding channel patterns CP, and each of the landing pads LP may be coupled in common to the first and second vertical parts VP1 and VP2.

The data storage patterns DSP may be located on corresponding landing pads LP, and each of the data storage patterns DSP may be connected in common through the landing pad LP to the first and second vertical parts VP1 and VP2 of a corresponding channel pattern CP. When viewed in plan, the data storage patterns DSP may be placed at locations where the first and second word lines WL1 and WL2 intersect the bit lines BL. For example, the data storage patterns DSP may be arranged in a matrix shape along the first and second directions D1 and D2.

Figure 15:
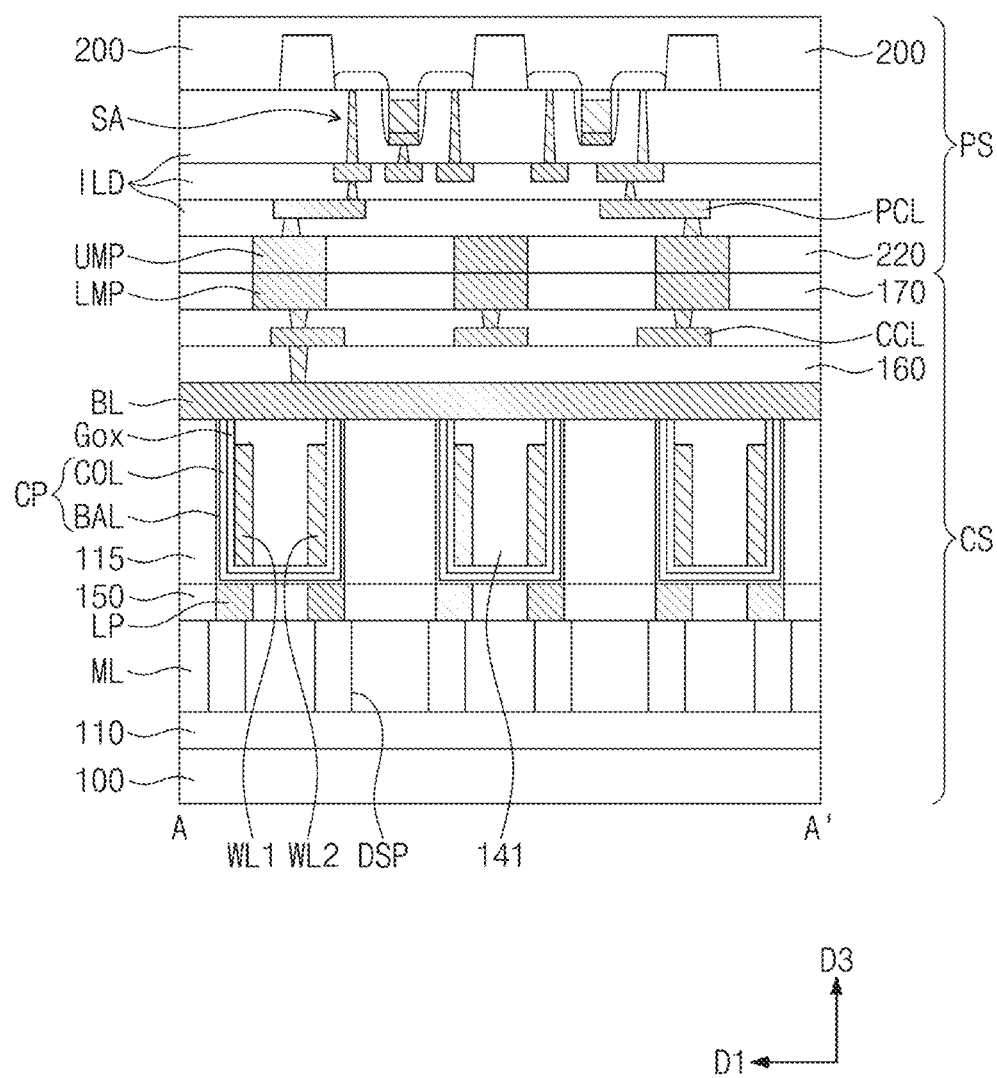
FIG. 15 illustrates a cross-sectional view taken along line A-A' of FIG. 8, showing a semiconductor memory device according to some example embodiments of inventive concepts.

FIG. 15 illustrates a cross-sectional view taken along line A-A' of FIG. 8, showing a semiconductor memory device according to some example embodiments of inventive concepts. An explanation discussed above will be omitted, and a difference will be described in detail. Hereinafter, some example embodiments of inventive concepts will be discussed in detail also with reference to FIGS. 10A to 10D.

A semiconductor memory device may include a cell array structure including lower metal pads LMP on an uppermost layer thereof and a peripheral circuit structure PS including upper metal pads UMP on an uppermost layer thereof. A bonding method may be employed to electrically and physically connect the lower metal pads LMP of the cell array structure CS to the upper metal pads UMP of the peripheral circuit structure PS. The lower and upper metal pads LMP and UMP may include a metallic material, such as copper (Cu).

For example, the cell array structure CS may include a plurality of data storage patterns DSP, first and second word lines WL1 and WL2 that extend in a second direction D2 on the data storage patterns DSP and are alternately arranged in the first direction D1, bit lines BL that extend in a first direction D1 on the first and second word lines WL1 and WL2 and are spaced apart from each other in the second direction D2, and the lower metal pads LMP electrically connected to the bit lines BL.

For example, the data storage patterns DSP may be located on a lower dielectric layer 110 that covers a first semiconductor substrate 100. The data storage patterns DSP may be capacitors provided in a mold layer ML, each of which capacitors includes a bottom electrode, a top electrode, and a dielectric layer between the bottom and top electrode.

Landing pads LP may be provided on corresponding data storage patterns DSP, and an interlayer dielectric layer 150 may fill spaces between the landing pads LP.

Channel patterns CP may be located on corresponding landing pads LP, and as discussed above, each of the channel patterns CP may include a horizontal part HP and first and second vertical parts VP1 and VP2 that vertically protrude from the horizontal part HP. The horizontal part HP of the channel pattern CP may be in contact with top surfaces of the landing pads LP.

The first and second word lines WL1 and WL2 may be located on the horizontal part HP of the channel pattern CP. As discussed above, the first and second word lines WL1 and WL2 may extend in the second direction D2 and may be spaced apart from each other in the first direction D1.

Each of the bit lines BL may be in contact with top surfaces of the first and second vertical parts VP1 and VP2 included in the channel pattern CP that are arranged along the first direction D1. The bit lines BL may be electrically connected through cell metal structures CCL to the lower metal pads LMP. The lower metal pads LMP may be located on an uppermost dielectric layer 170 of the cell array structure CS.

The peripheral circuit structure PS may include a core and peripheral circuits SA integrated on a second semiconductor substrate 200, peripheral circuit contact plugs and peripheral circuit lines PCL that are electrically connected to the core and the peripheral circuits SA, and the upper metal pads UMP electrically connected to the peripheral circuit lines PCL. The upper metal pads UMP may be located on an uppermost dielectric layer 220 of the peripheral circuit structure PS.

The lower and upper metal pads LMP and UMP may have substantially the same size and arrangement. The lower and upper metal pads LMP and UMP may include, for example, copper (Cu), aluminum (Al), nickel (Ni), cobalt (Co), tungsten (W), titanium (Ti), tin (Sn), or any alloy thereof.

The semiconductor memory device according to some example embodiments of inventive concepts may be fabricated by forming the cell array structure CS including memory cells on the first semiconductor substrate 100, forming the peripheral circuit structure PS including the core and the peripheral circuits SA on the second semiconductor substrate 200 different from the first semiconductor substrate 100, and then using a bonding method to connect the first semiconductor substrate 100 to the second semiconductor substrate 200. For example, a bonding method may be employed to electrically and physically connect the lower metal pads LMP of the cell array structure CS to the upper metal pads UMP of the peripheral circuit structure PS. Thus, the lower metal pads LMP may be in direct contact with the upper metal pads UMP.

FIGS. 16A to 21A, 16B to 21B, and 16C to 21C illustrate cross-sectional views respectively taken along lines A-A', B-B', and C-C' of FIG. 8, showing a method of fabricating a semiconductor memory device according to some example embodiments of inventive concepts.

Figure 16A:
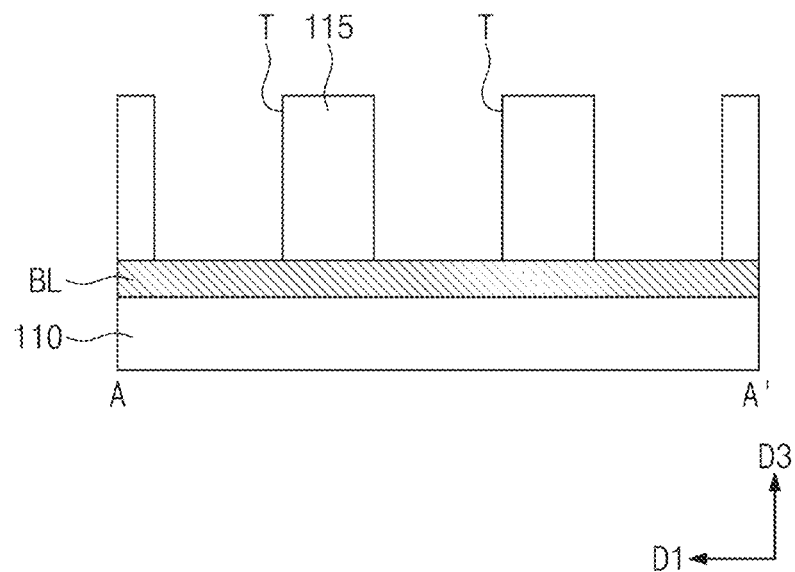
Figure 16B:
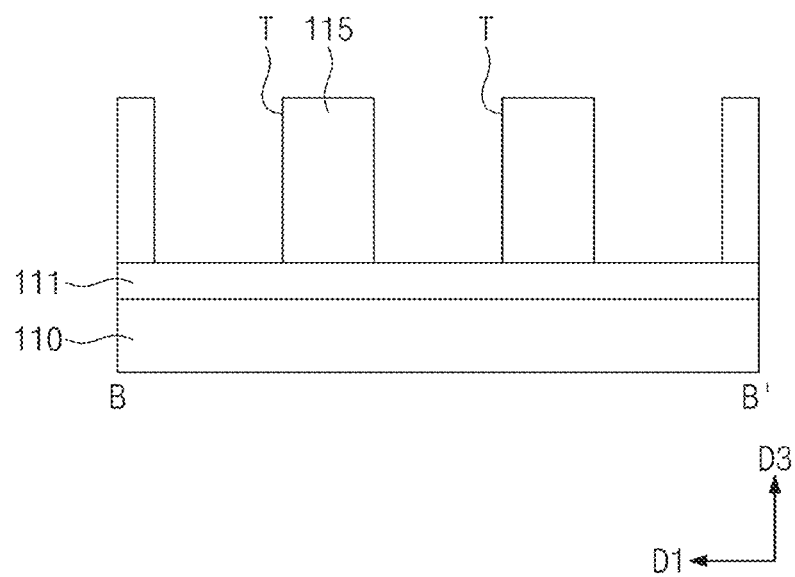
Figure 16C:
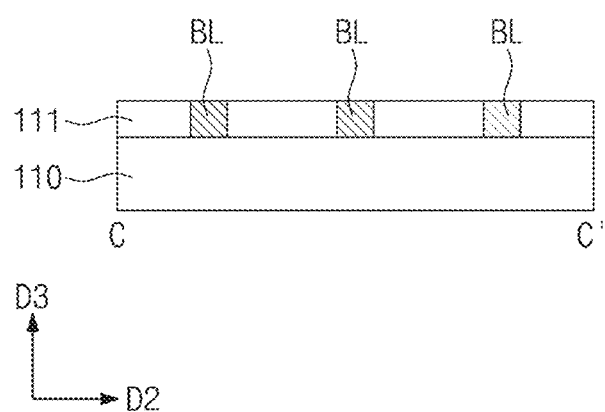

Referring to FIGS. 16A to 16C, bit lines BL may be formed to extend in a first direction D1 on a lower dielectric layer 110.

The lower dielectric layer 110 may cover a semiconductor substrate (not shown), and may include a plurality of stacked dielectric layers. For example, the lower dielectric layer 110 may include one or more of a silicon oxide layer, a silicon nitride layer, a silicon oxynitride layer, and a low-k dielectric layer.

The bit lines BL may be formed by depositing a conductive layer on the lower dielectric layer 110, and then patterning the conductive layer. A filling dielectric layer 111 may fill spaces between the bit lines BL, and may have a top surface substantially coplanar with those of the bit lines BL. Alternatively, the bit lines BL may be formed by forming trenches in the filling dielectric layer 111, and then filling the trenches with a conductive material.

A first dielectric pattern 115 may be formed on the lower dielectric layer 110. The first dielectric pattern 115 may extend in a second direction D2, and may define trenches T that are spaced apart from each other in the first direction D1. The trenches T may partially expose the bit lines BL.

The first dielectric pattern 115 may be formed of a dielectric material having an etch selectivity with respect to the lower dielectric layer 110. The first dielectric pattern 115 may be formed of, for example, one or more of a silicon oxide layer a silicon nitride layer, a silicon oxynitride layer, and a low-k dielectric layer.

Figure 17A:
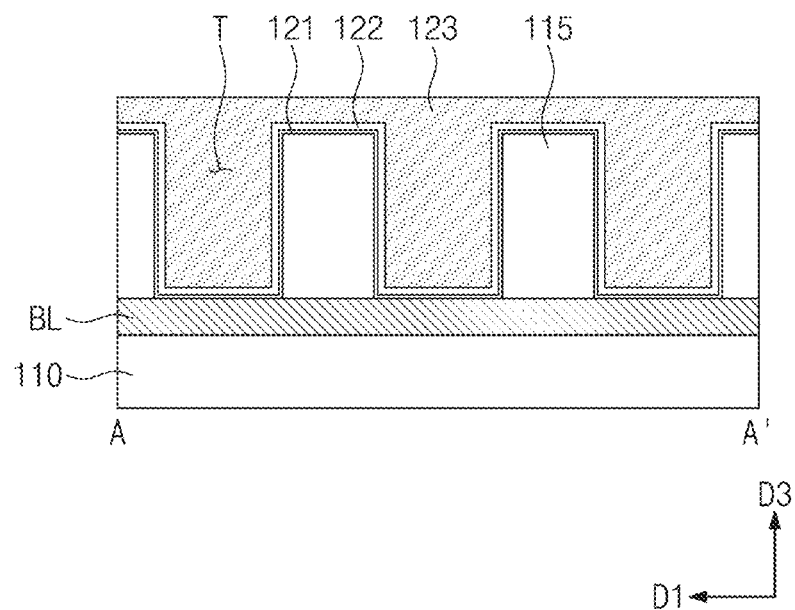
Figure 17B:
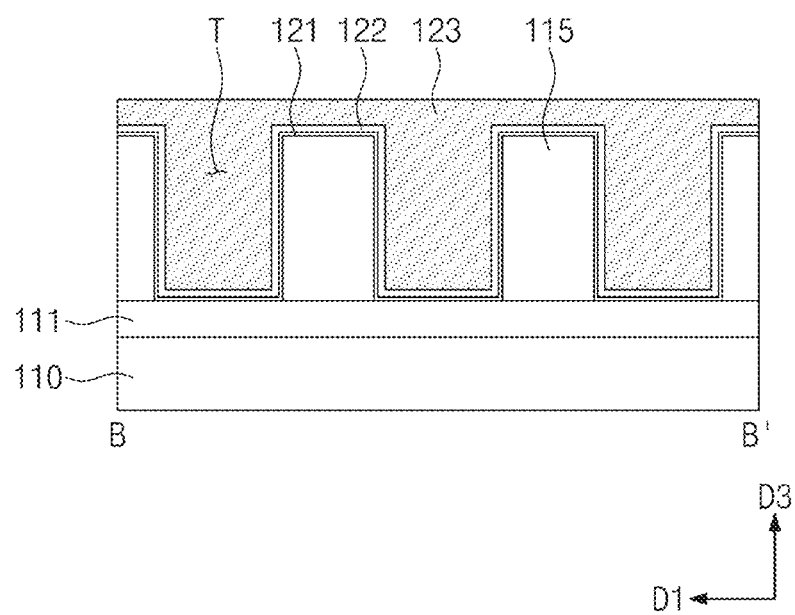
Figure 17C:
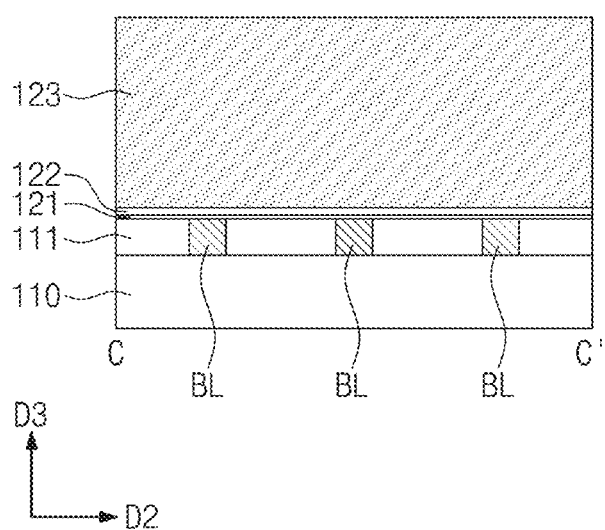

Referring to FIGS. 17A to 17C, a first active layer 121 may be formed to conformally cover the first dielectric pattern 115 having the trenches T. The first active layer 121 in the trenches T may contact the bit lines BL, and may cover a top surface and sidewalls of the first dielectric pattern 115.

An atomic layer deposition (ALD) process may be used to form the first active layer 121. The first active layer 121 may have a substantially uniform thickness to cover bottom surfaces and inner walls of the trenches T. The first active layer 121 may be formed to have a thickness of, for example, about 1 nm to about 3 nm. The first active layer 121 may include an oxide semiconductor material. The first active layer 121 may include, for example, indium gallium zinc oxide (IGZO).

A second active layer 122 may be conformally formed on the first active layer 121. The second active layer 122 may conformally cover the first active layer 121. An atomic layer deposition process may be used to form the second active layer 122. The second active layer 122 may have a uniform/substantially uniform thickness to cover the first active layer 121. The second active layer 122 may be formed to have a thickness of, for example, about 3 nm to about 7 nm. The second active layer 122 may include an oxide semiconductor material. The second active layer 122 may include, for example, IGZO.

When an atomic layer deposition process is performed, an introduction amount of a precursor of one or more of indium (In), gallium (Ga), or zinc (Zn) may be adjusted to control a composition ratio of the oxide semiconductor material that constitutes the first active layer 121 or the second active layer 122.

A concentration of gallium (Ga) in the second active layer 122 may be less than that in the first active layer 121. A concentration of indium (In) in the second active layer 122 may be greater than that in the first active layer 121. For example, the second active layer 122 may include IGZO, which may have a composition ratio of $In_{0.61}Ga_{0.16}Zn_{0.23}O$, and the first active layer 121 may include IGZO, which may have a composition ratio of $In_{0.38}Ga_{0.44}Zn_{0.18}O$, $In_{0.52}Ga_{0.32}Zn_{0.15}O$, or $In_{0.46}Ga_{0.19}Zn_{0.34}O$.

The second active layer 122 may have a band gap less than that of the first active layer 121. For example, when the second active layer 122 whose thickness is about 5 nm has a composition ratio of $In_{0.61}Ga_{0.16}Zn_{0.23}O$, the second active layer 122 may have a band gap of about 3.59 eV, and when the first active layer 121 whose thickness is about 2 nm has a composition ratio of $In_{0.46}Ga_{0.19}Zn_{0.34}O$, the first active layer 121 may have a band gap of about 4.02 eV. An oxide semiconductor layer may have a band gap that increases with an increase in concentration of gallium.

The second active layer 122 may have a work function greater than that of the first active layer 121. For example, when the second active layer 122 whose thickness is about 5 nm has a composition ratio of $In_{0.61}Ga_{0.16}Zn_{0.23}O$, the second active layer 122 may have a work function of about 4.64 eV, and when the first active layer 121 whose thickness is about 2 nm has a composition ratio of $In_{0.46}Ga_{0.19}Zn_{0.34}O$, the first active layer 121 may have a work function of about 4.34 eV. An oxide semiconductor layer may have a work function that increases with an increase in concentration of gallium and a reduction in concentration of indium. In addition, an oxide semiconductor layer may have a work function that increases with an increase in thickness thereof.

A sacrificial layer 123 may be formed on the second active layer 122 to thereby fill remaining portions of the trenches T. The sacrificial layer 123 may have a substantially flat top surface. The sacrificial layer 123 may be formed of a dielectric material having an etch selectivity with respect to the first dielectric pattern 115. For example, the sacrificial layer 123 may be one of dielectric materials and silicon oxides that are formed by using spin-on-glass (SOG) technology.

Figure 18A:
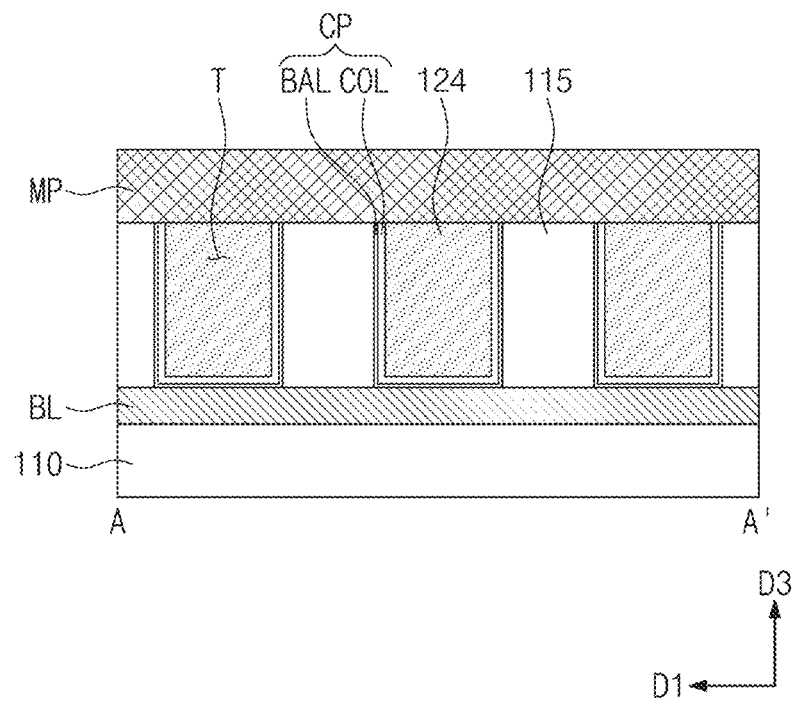
Figure 18B:
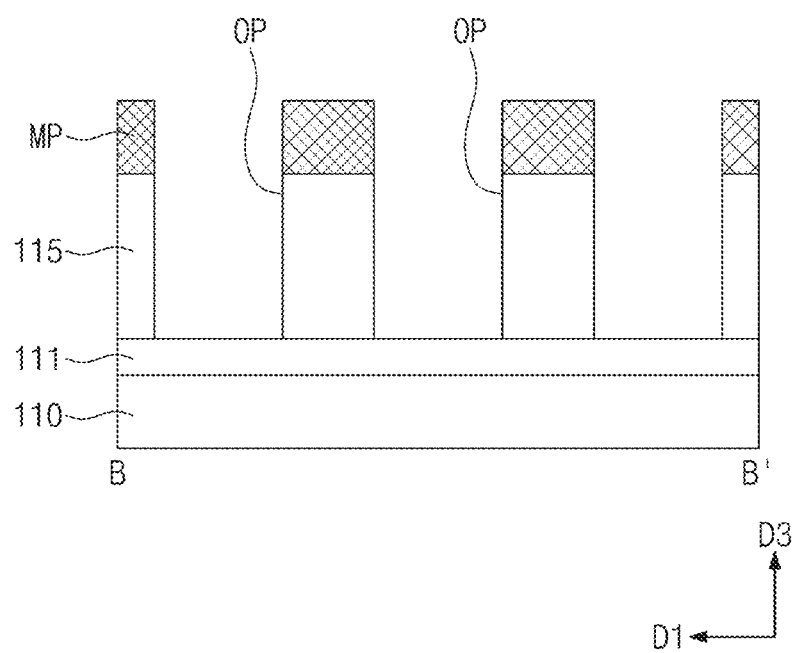
Figure 18C:
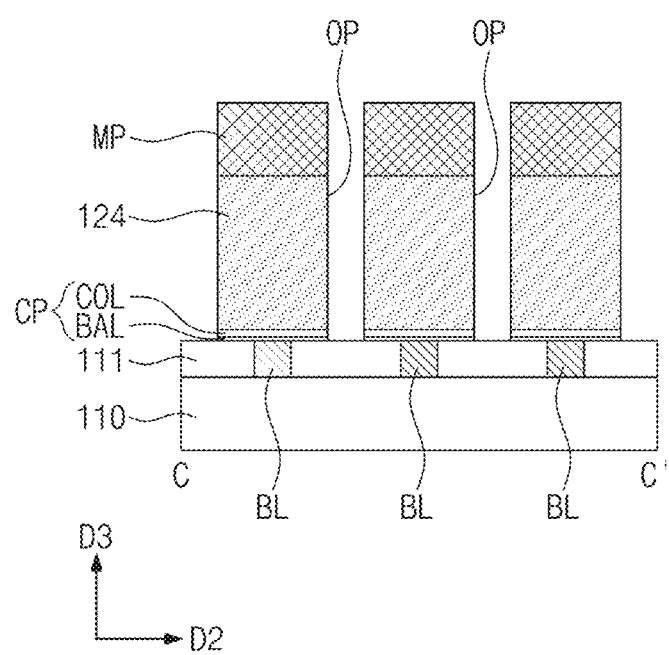

Referring to FIGS. 18A to 18C, the sacrificial layer 123, the second active layer 122, and the first active layer 121 may undergo a planarization process to form a mask pattern MP on planarized sacrificial, second active, and first active layers 123, 122, and 121.

The mask pattern MP may have openings whose major axes are parallel to the first direction D1 on the first dielectric pattern 115. The openings of the mask pattern MP may be spaced apart from each other in the second direction D2. When viewed in plan, the openings of the mask pattern MP may be positioned between the bit lines BL. The mask pattern MP may partially expose a top surface of the second active layer 122.

Successively, the mask pattern MP may be used as an etching mask to sequentially etch the sacrificial layer 123, the second active layer 122, and the first active layer 121 to form openings OP that expose the filling dielectric layer 111 between the bit lines BL.

The second active layer 122 and the first active layer 121 may be etched to form channel patterns CP. The etched first active layer 121 may constitute a barrier layer BAL, and the etched second active layer 122 may constitute a confinement layer COL. The sacrificial layer 123 may be etched to form sacrificial patterns 124.

Each of the channel patterns CP may include a horizontal part in contact with the bit line BL, and may also include first and second vertical parts that extend from the horizontal part and contact sidewalls of each trench T.

After the channel patterns CP are formed, an ashing process may be performed to remove the mask pattern MP.

Figure 19A:
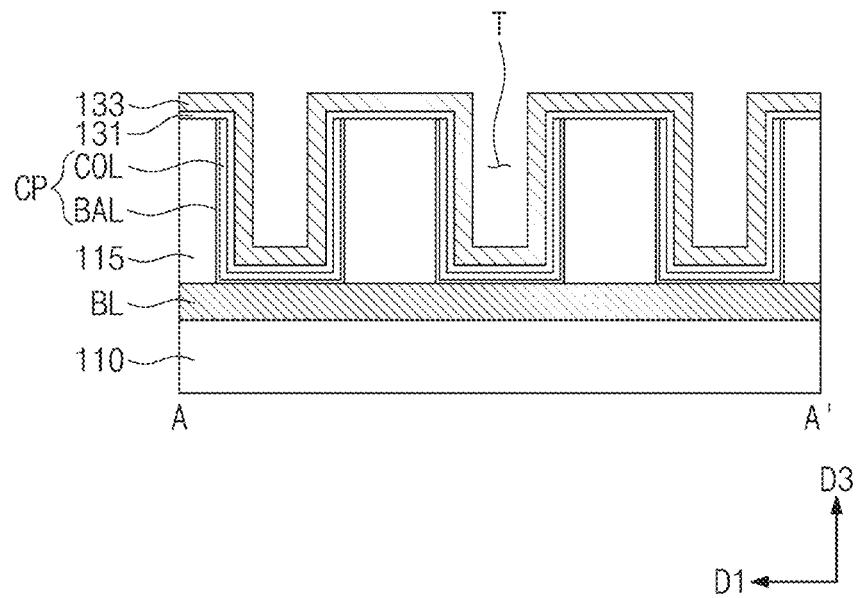
Figure 19B:
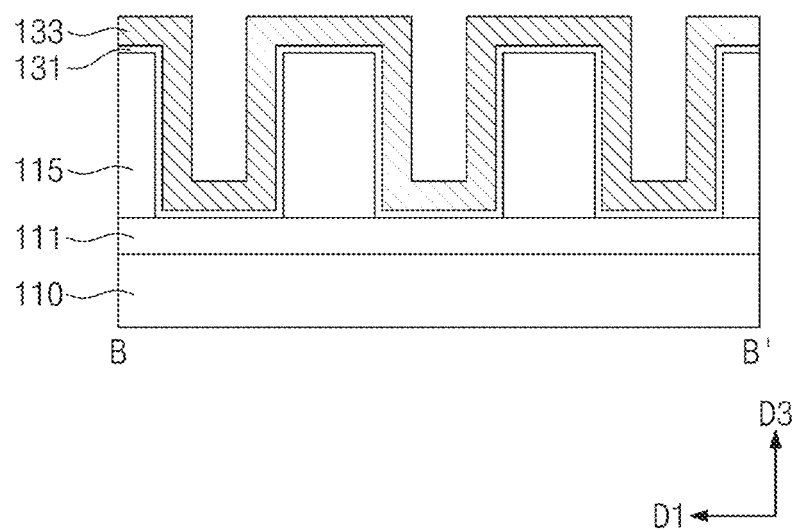
Figure 19C:
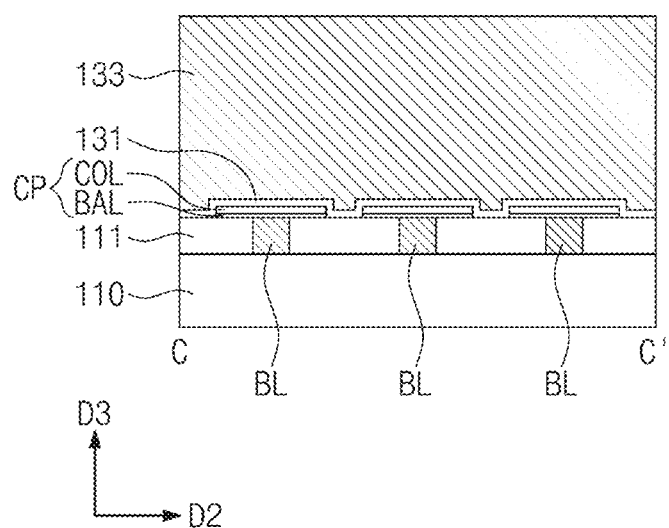

Referring to FIGS. 19A to 19C, the sacrificial patterns 124 may be removed by using an etching recipe that has an etch selectivity with respect to the first dielectric pattern 115 and the channel patterns CP.

A gate dielectric layer 131 and a gate conductive layer 133 may be sequentially deposited to conformally cover the channel patterns CP. The gate dielectric layer 131 and the gate conductive layer 133 may be formed by using at least one selected from physical vapor deposition (PVD), thermal chemical deposition process (thermal CVD), low pressure chemical vapor deposition (LPCVD), plasma enhanced chemical vapor deposition (PECVD), and atomic layer deposition (ALD).

The gate dielectric layer 131 and the gate conductive layer 133 may have uniform/substantially uniform thicknesses to cover the horizontal part and the first and second vertical parts of the channel patterns CP.

The gate dielectric layer 131 between the channel patterns CP may be in direct contact with sidewalls of the filling dielectric layer 111 and the first dielectric pattern 115.

Figure 20A:
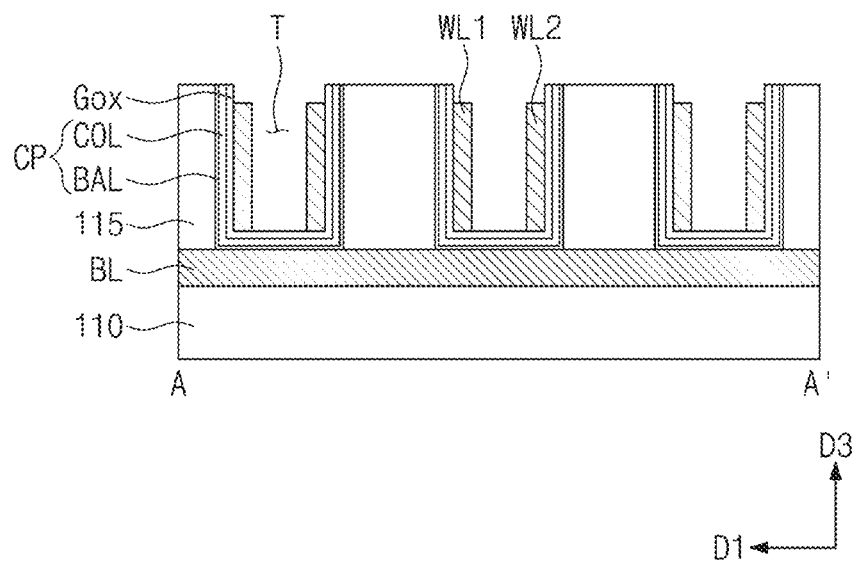
Figure 20B:
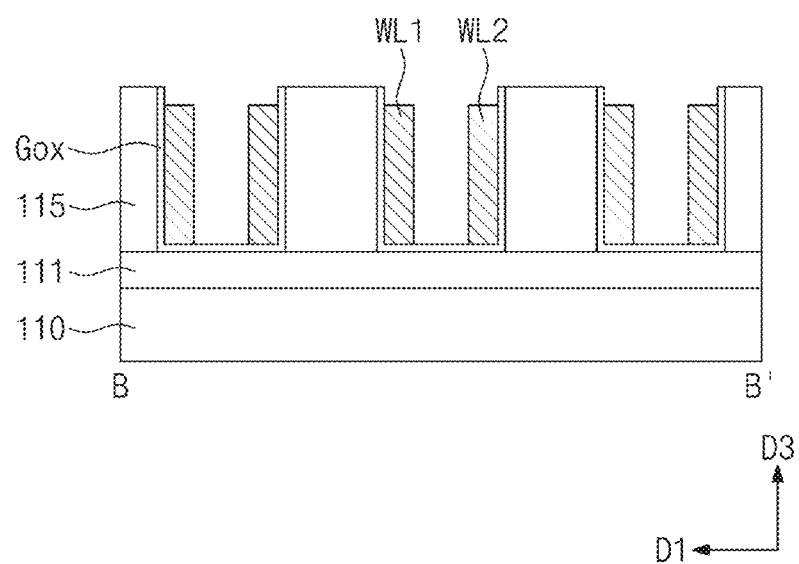
Figure 20C:
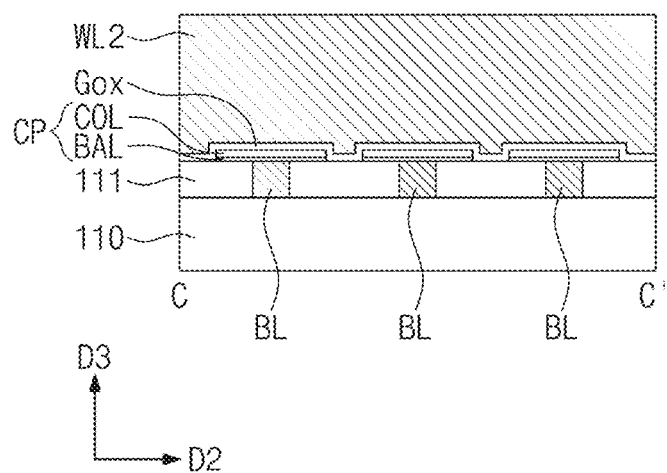

Referring to FIG. 20A to 20C, the gate conductive layer 133 may undergo an anisotropic etching process to form a pair of first and second word lines WL1 and WL2 that are separated from each other in each trench T. When the anisotropic etching process is performed on the gate conductive layer 133, top surfaces of the first and second word lines WL1 and WL2 may become lower than those of the channel patterns CP. Alternatively, an etching process may be additionally performed to recess the top surfaces of the first and second word lines WL1 and WL2.

Successively, an anisotropic etching process such as a dry etching process may be executed to the gate dielectric layer 131 exposed to the first and second word lines WL1 and WL2. Therefore, a gate dielectric pattern Gox may be formed.

Figure 21A:
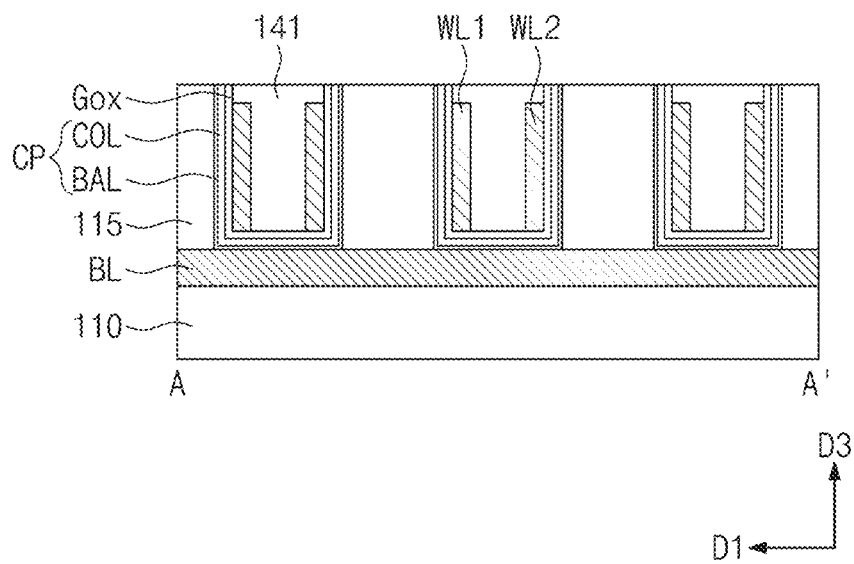
Figure 21B:
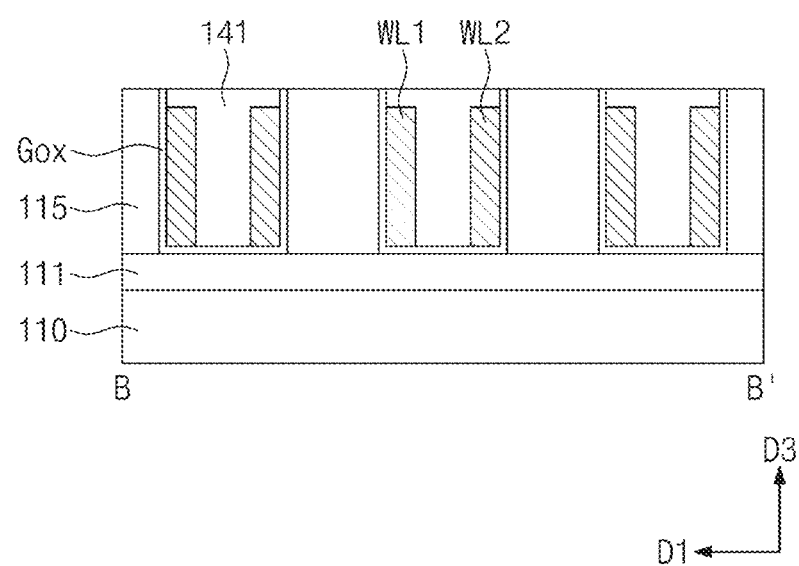
Figure 21C:
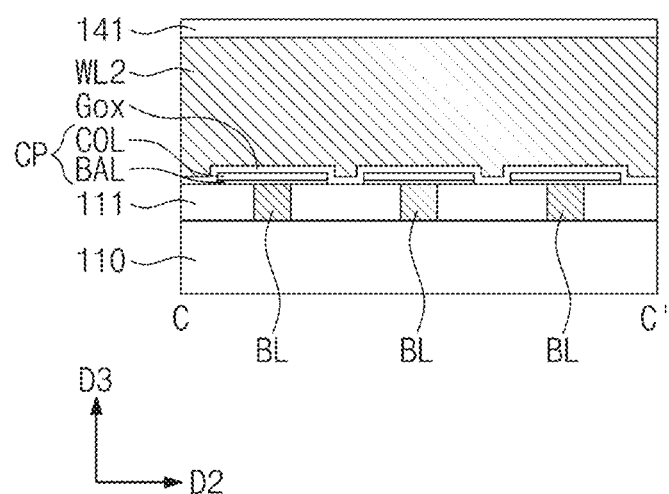

Referring to FIGS. 21A to 21C, a second dielectric pattern 141 may be formed between the first and second word lines WL1 and WL2.

The second dielectric pattern 141 may be formed by depositing a dielectric layer to completely fill the trenches (see T of FIG. 20A) in which the first and second word lines WL1 and WL2 are formed, and then performing a planarization process until the top surface of the first dielectric pattern 115 is exposed. The second dielectric pattern 141 may be formed of, for example, one or more of a silicon oxide layer a silicon nitride layer, a silicon oxynitride layer, and a low-k dielectric layer.

Referring back to FIGS. 8 and 9A to 9C, an interlayer dielectric layer 150 may be formed on the first dielectric pattern 115 and the second dielectric pattern 141. In the interlayer dielectric layer 150, landing pads LP may be formed to correspondingly contact the first and second vertical parts of the channel patterns CP. The landing pads LP may be formed by patterning the interlayer dielectric layer 150 to form holes that expose the first and second vertical parts of the channel patterns CP, and then filling the holes with a conductive material.

Afterwards, data storage elements DSP may be formed on corresponding landing pads LP. For example, when the data storage patterns DSP include capacitors, bottom electrodes, a capacitor dielectric layer, and a top electrode may be sequentially formed.

According to inventive concepts, a channel pattern of a semiconductor memory device may include a first oxide semiconductor layer and a second oxide semiconductor layer. An atomic layer deposition process may be used to form the first oxide semiconductor layer and the second oxide semiconductor layer. Therefore, thicknesses and composition ratios of the first and second oxide semiconductor layers may be adjusted to easily control band gaps and work functions of the first and second oxide semiconductor layers. It may then be possible to provide the semiconductor memory device with improved, e.g. optimized, electrical properties. In conclusion, the semiconductor memory device may increase in electrical properties.

Any of the elements disclosed above may include and/or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although inventive concepts have been described in connection with the some example embodiments of inventive concepts illustrated in the accompanying drawings, it will be understood by one of ordinary skill in the art that variations in form and detail may be made therein without departing from the spirit and essential feature of inventive concepts. The above example embodiments should thus be considered illustrative and not restrictive. Furthermore, none of the example embodiments are necessarily mutually exclusive with one another. For example, some example embodiments may include features described with reference to one or more figures, and may also include features described with reference to one or more other figures.

What is claimed is:

1. A semiconductor memory device, comprising:
    a bit line extending in a first direction;
    a channel pattern on the bit line, the channel pattern including a first oxide semiconductor layer contacting the bit line and a second oxide semiconductor layer on the first oxide semiconductor layer, each of the first and second oxide semiconductor layers including a horizontal part parallel to the bit line and a first vertical part and a second vertical part that vertically protrude from the horizontal part;
    a first word line and a second word line that are between the first and second vertical parts of the second oxide semiconductor layer and are on the horizontal part of the second oxide semiconductor layer, the first and second word lines running across the bit line; and
    a gate dielectric pattern between the channel pattern and the first and second word lines, the gate dielectric pattern on the first and second vertical parts,
    wherein a thickness of the second oxide semiconductor layer is greater than a thickness of the first oxide semiconductor layer.

2. The semiconductor memory device of claim 1, wherein a concentration of gallium (Ga) of the channel pattern increases with distance from the first word line.

3. The semiconductor memory device of claim 1, wherein each of the first and second oxide semiconductor layers includes indium gallium zinc oxide (IGZO), and
    wherein a concentration of gallium (Ga) in the first oxide semiconductor layer is greater than a concentration of gallium (Ga) in the second oxide semiconductor layer.

4. The semiconductor memory device of claim 1, wherein a band gap of the first oxide semiconductor layer is greater than a band gap of the second oxide semiconductor layer.

5. The semiconductor memory device of claim 1, wherein a work function of the first oxide semiconductor layer is less than a work function of the second oxide semiconductor layer.

6. The semiconductor memory device of claim 1, wherein top surfaces of either the first and second word lines are at a level lower than a lowest level of top surfaces of either the first and second vertical parts of the second oxide semiconductor layer.

7. The semiconductor memory device of claim 1, wherein a thickness of the channel pattern is in a range of about 4 nm to about 10 nm.

8. The semiconductor memory device of claim 7, wherein the thickness of the first oxide semiconductor layer is in a range of about 1 nm to about 3 nm, and
    the thickness of the second oxide semiconductor layer is in a range of about 3 nm to about 7 nm.

9. The semiconductor memory device of claim 1, wherein the channel pattern includes a horizontal part parallel to the bit line, and a first vertical part and a second vertical part that vertically protrude from the horizontal part of the channel pattern,
    the horizontal part of the channel pattern includes the horizontal part of the first oxide semiconductor layer and the horizontal part of the second oxide semiconductor layer,
    the first vertical part of the channel pattern includes the first vertical part of the first oxide semiconductor layer and the first vertical part of the second oxide semiconductor layer, and the second vertical part of the channel pattern includes the second vertical part of the first oxide semiconductor layer and the second vertical part of the second oxide semiconductor layer.

10. The semiconductor memory device of claim 9, wherein
the first vertical part of the channel pattern connects to a first data storage pattern, and
the second vertical part of the channel pattern connects to a second data storage pattern.

11. A semiconductor memory device, comprising:
a bit line extending in a first direction;
a channel pattern on the bit line, the channel pattern including a horizontal part parallel to the bit line, and a first vertical part and a second vertical part that vertically protrude from the horizontal part;
a first word line on the horizontal part of the channel pattern, the first word line running across the bit line and extending in a second direction; and
a gate dielectric pattern between the first word line and the channel pattern, the gate dielectric pattern on the first vertical part,
wherein the channel pattern includes,
a first oxide semiconductor layer in contact with the bit line, and
a second oxide semiconductor layer on the first oxide semiconductor layer,
wherein a concentration of gallium (Ga) in the first oxide semiconductor layer is greater than a concentration of gallium (Ga) in the second oxide semiconductor layer.

12. The semiconductor memory device of claim 11, wherein a concentration of gallium (Ga) of the channel pattern increases with distance from the first word line.

13. The semiconductor memory device of claim 11, further comprising:
a data storage pattern connected in common to the first and second vertical parts of the channel pattern.

14. The semiconductor memory device of claim 13, further comprising:
a second word line on the horizontal part of the channel pattern and apart from the first word line, the second word line extending in the second direction,
wherein each of the first and second vertical parts of the channel pattern has an inner sidewall and an outer sidewall that are opposite to each other, the inner sidewalls of the first and second vertical parts facing each other,
the first word line includes a first inner gate electrode adjacent to the inner sidewall of the first vertical part and includes a first outer gate electrode adjacent to the outer sidewall of the first vertical part, and
the second word line includes a second inner gate electrode adjacent to the inner sidewall of the second vertical part and includes a second outer gate electrode adjacent to the outer sidewall of the second vertical part.

15. The semiconductor memory device of claim 11, further comprising:
a second word line on the horizontal part of the channel pattern and spaced apart from the first word line, the second word line extending in the second direction,
wherein an outer sidewall of the first word line is adjacent to the first vertical part, and
an outer sidewall of the second word line is adjacent to the second vertical part.

16. The semiconductor memory device of claim 1, wherein the second oxide semiconductor layer is directly on the first oxide semiconductor layer.

17. The semiconductor memory device of claim 1, wherein the second oxide semiconductor layer and the first oxide semiconductor layer have an interface therebetween.

18. The semiconductor memory device of claim 17, wherein the first oxide semiconductor layer and the second oxide semiconductor layer are configured to have a two-dimensional electron gas formed at the interface.

19. The semiconductor memory device of claim 11, wherein the second oxide semiconductor layer and the first oxide semiconductor layer have an interface therebetween.

20. The semiconductor memory device of claim 11, wherein the second oxide semiconductor layer is directly on the first oxide semiconductor layer.

* * * * *